United States Patent
Yagyu

(10) Patent No.: US 10,128,130 B2
(45) Date of Patent: Nov. 13, 2018

(54) METHOD FOR MANUFACTURING A SEMICONDUCTOR DEVICE

(71) Applicant: RENESAS ELECTRONICS CORPORATION, Tokyo (JP)

(72) Inventor: Yuki Yagyu, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/829,250

(22) Filed: Dec. 1, 2017

(65) Prior Publication Data
US 2018/0182644 A1 Jun. 28, 2018

(30) Foreign Application Priority Data

Dec. 27, 2016 (JP) ................................ 2016-252468

(51) Int. Cl.
*H01L 23/49* (2006.01)
*H01L 21/56* (2006.01)
(Continued)

(52) U.S. Cl.
CPC ........ *H01L 21/561* (2013.01); *B29C 45/0046* (2013.01); *B29C 45/14655* (2013.01);
(Continued)

(58) Field of Classification Search
CPC . H01L 21/561; H01L 21/565; H01L 2224/44; H01L 2224/47;
(Continued)

(56) References Cited

U.S. PATENT DOCUMENTS 7,323,788 B2 * 1/2008 Miyaki ........... H01L 21/823871
257/773
8,525,306 B2 * 9/2013 Tashiro ............... B29C 45/0046
257/666
(Continued)

FOREIGN PATENT DOCUMENTS

JP       08-236564 A     9/1996
JP     2009117520 A *   5/2009   ............. H01L 24/49
(Continued)

OTHER PUBLICATIONS

European Search Report issued in corresponding European Patent Application No. 17208831.2-1212, dated Jun. 14, 2018.

*Primary Examiner* — Earl Taylor
(74) *Attorney, Agent, or Firm* — McDermott, Will & Emery LLP

(57) ABSTRACT

A compact and high-reliability semiconductor device is implemented. The bonding wires situated in the vicinity of a gate, and the bonding wires situated in the vicinity of a vent facing to the gate across the center of a semiconductor chip in a molding step have a loop shape falling inwardly of the semiconductor chip, have a weaker pulling force (tension) than those of other bonding wires, and are loosely stretched with a margin. The bonding wires situated in the vicinity of the gate in the molding step are, for example, a first wire and a fifth wire to be connected with a first electrode pad and a fifth electrode pad, respectively. Whereas, the bonding wires situated in the vicinity of the vent in the molding step are, for example, a third wire and a seventh wire to be connected with a third electrode pad and a seventh electrode pad, respectively.

19 Claims, 22 Drawing Sheets

(51) Int. Cl.
*H01L 23/31* (2006.01)
*H01L 23/498* (2006.01)
*B29C 45/14* (2006.01)
*H01L 23/00* (2006.01)
*B29C 45/00* (2006.01)

(52) U.S. Cl.
CPC ...... *B29C 45/14836* (2013.01); *H01L 21/565* (2013.01); *H01L 23/3128* (2013.01); *H01L 23/49838* (2013.01); *H01L 24/49* (2013.01); *H01L 24/78* (2013.01); *H01L 24/97* (2013.01)

(58) Field of Classification Search
CPC ....... H01L 2224/49176; H01L 23/3128; H01L 23/49838; H01L 24/44; H01L 24/47; H01L 24/49; H01L 24/78; H01L 24/97; B29C 45/0049; B29C 45/14655; B29C 45/14836
See application file for complete search history.

(56) References Cited

U.S. PATENT DOCUMENTS

| | | | | |
|---|---|---|---|---|
| 9,293,436 | B2* | 3/2016 | Akiba | H01L 24/97 |
| 9,972,598 | B2* | 5/2018 | Yagyu | H01L 24/85 |
| 2002/0043701 | A1* | 4/2002 | Tiziani | H01L 23/49541 |
| | | | | 257/666 |
| 2003/0178708 | A1* | 9/2003 | Minamio | H01L 21/4842 |
| | | | | 257/666 |
| 2004/0041250 | A1* | 3/2004 | Nose | H01L 23/3107 |
| | | | | 257/690 |
| 2005/0121805 | A1* | 6/2005 | Matsuzawa | H01L 23/49838 |
| | | | | 257/784 |
| 2006/0097371 | A1* | 5/2006 | Kawasaki | H01L 23/4334 |
| | | | | 257/678 |
| 2009/0045492 | A1* | 2/2009 | Oga | H01L 21/565 |
| | | | | 257/675 |
| 2014/0353809 | A1* | 12/2014 | Shimizu | H01L 23/49513 |
| | | | | 257/676 |
| 2015/0333030 | A1* | 11/2015 | Akiba | H01L 24/03 |
| | | | | 257/764 |
| 2016/0197050 | A1* | 7/2016 | Akiba | H01L 24/03 |
| | | | | 257/48 |
| 2017/0053893 | A1 | 2/2017 | Fukue | |
| 2018/0082977 | A1* | 3/2018 | Yagyu | H01L 24/85 |

FOREIGN PATENT DOCUMENTS

| | | | | |
|---|---|---|---|---|
| JP | 2012-028429 A | | 2/2012 | |
| JP | 2013197426 A | * | 9/2013 | ............ H01L 24/97 |
| WO | 2015/080000 A1 | | 6/2015 | |

* cited by examiner

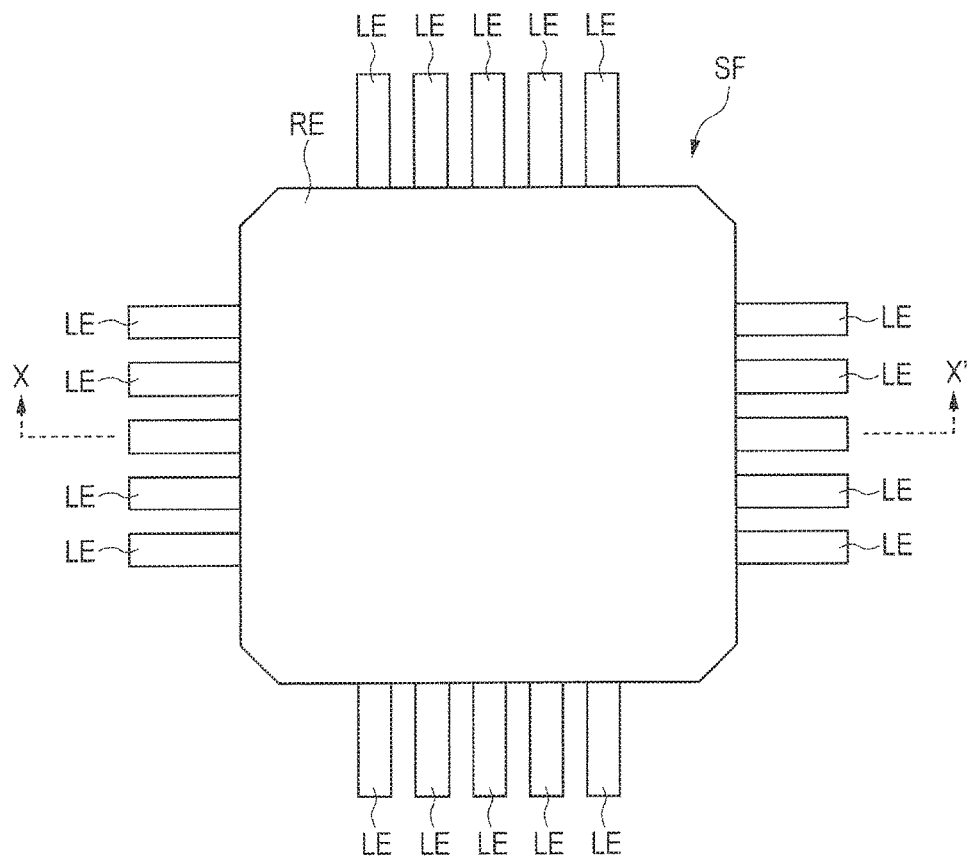
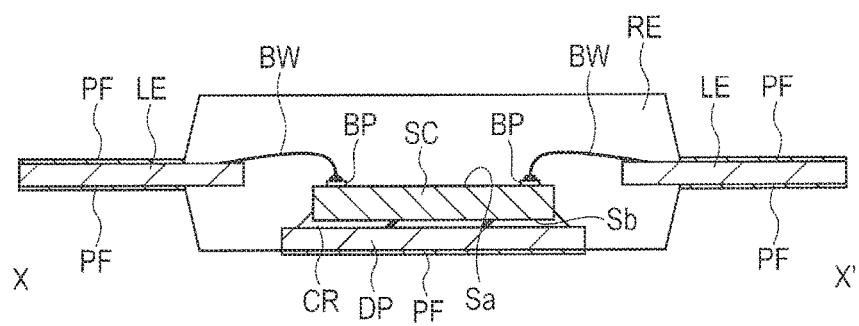

METHOD FOR MANUFACTURING A SEMICONDUCTOR DEVICE

CROSS-REFERENCE TO RELATED APPLICATIONS

The disclosure of Japanese Patent Application No. 2016-252468 filed on Dec. 27, 2016 including the specification, drawings and abstract is incorporated herein by reference in its entirety.

BACKGROUND

The present invention relates to a method for manufacturing a semiconductor device, and is preferably applicable to, for example, a packaging technology of resin sealing a semiconductor device using a bonding wire by a transfer mold method.

Patent Document 1 discloses the following technology: in a semiconductor device in which a chip is mounted on the upper surface of a wiring substrate, and bonding leads of the wiring substrate and the bonding pads of the chip are electrically connected by wires, respectively, the diameter of the wire arranged at the closest position to the corner part of the chip, and having the longest wire length is set larger than the diameters of other wires; as a result, the short circuit between adjacent wires is suppressed.

CITED DOCUMENT

Patent Document

[Patent Document 1] Japanese Unexamined Patent Application Publication No. 2012-28429

SUMMARY

As a means for implementing size reduction and cost reduction of a semiconductor device using a bonding wire, it is considered that the wire diameter of the bonding wire is reduced. However, the study by the present inventors revealed the following: for example, for a package in which the semiconductor chip is sealed by a resin as with a QFP (Quad Flat Package) and a HQFP (Quad Flat Package with Heatspreader), when the wire diameter of the bonding wire is reduced, the problems such as (1) peeling of the junction part between the bonding wire and the electrode pad, and (2) cutting of the junction part (neck part) between the ball part and the core part of the bonding wire become more likely to be caused in, for example, a reliability test.

Other objects and novel features will be apparent from the description of this specification and the accompanying drawings.

In accordance with one embodiment, each of the bonding wires situated in the vicinity of the gate of a molding mold, and the bonding wires situated in the vicinity of the vent of the molding mold facing to the gate across the center of the semiconductor chip in a molding step has such a loop shape that a part of the bonding wire is situated inwardly of the semiconductor chip from the junction part between the ball part of the bonding wire and the electrode pad of the semiconductor chip.

In accordance with one embodiment, it is possible to implement a compact and high-reliability semiconductor device.

BRIEF DESCRIPTION OF THE DRAWINGS

FIGS. 10A and 10B are a plan view and a cross sectional view, respectively, each showing the semiconductor device in a lead cutting step in accordance with an embodiment;

FIG. 13A is a status view of the stress received by the bonding wires situated in the vicinity of the gate in the molding step, and FIG. 13B is a schematic view for illustrating the peeling of the ball part of the bonding wire;

FIG. 14A is a status view of the stress received by the bonding wires situated in the vicinity of the vent in the molding step, and FIG. 14B is a schematic view for illustrating the cutting of the junction part (neck part) between the ball part and the core part of the bonding wire;

DETAILED DESCRIPTION

Figure 1:
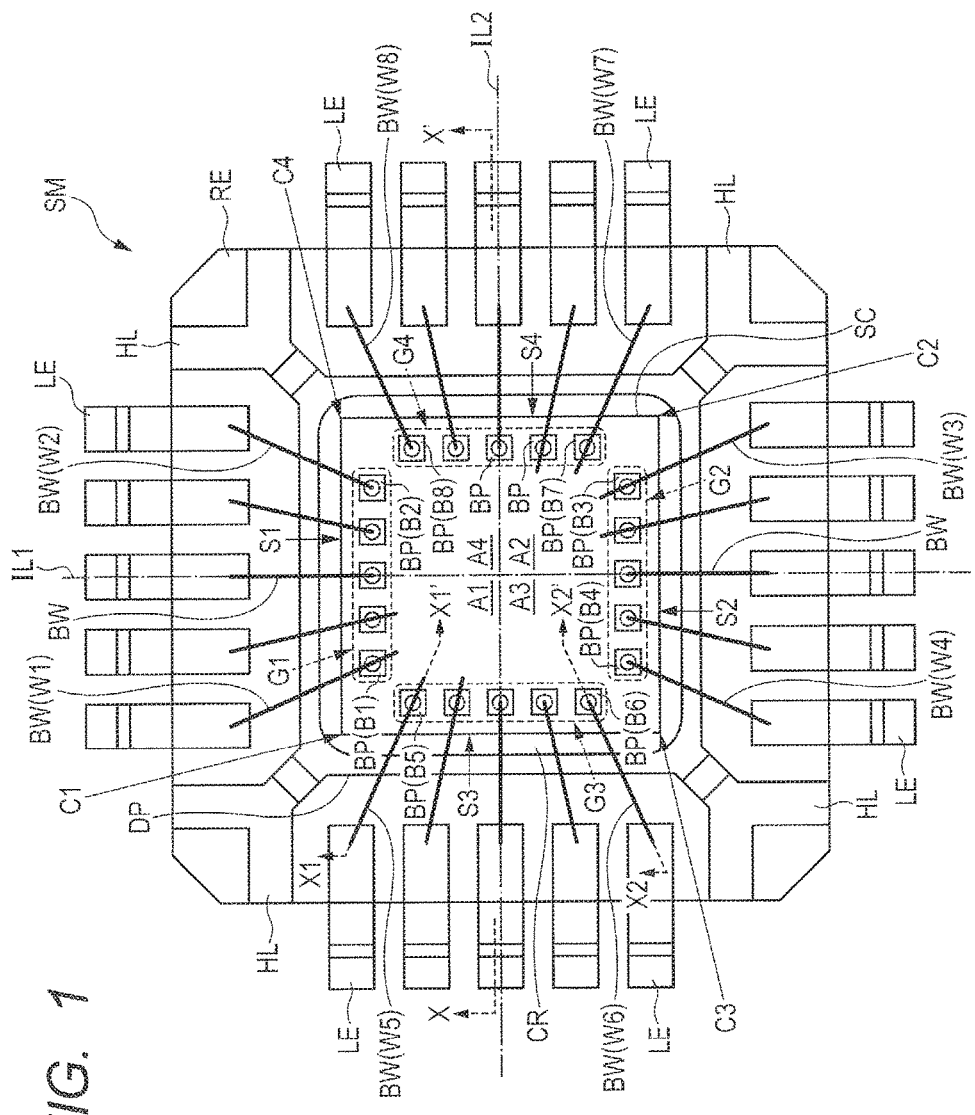
FIG. 1 is a top view of a semiconductor device in accordance with an embodiment.

In description of the following embodiment, the embodiment may be described in a plurality of divided sections or embodiments for convenience, if required. However, unless otherwise specified, these are not independent of each other, but, are in a relation such that one is a modified example, an applied example, a detailed description, a complementary explanation, or the like of a part or the whole of the other. Further, in the following embodiments, when a reference is made to the number of elements, and the like (including number, numerical value, quantity, range, or the like), the number of elements, or the like is not limited to the specific number, but may be greater than or less than the specific number, unless otherwise specified, except for the case where the number is apparently limited to the specific number in principle, or except for other cases.

Further, in the following embodiments, the constitutional elements (including element steps, or the like) are not always essential, unless otherwise specified, and except for the case where they are apparently considered essential in principle, or except for other cases. Similarly, in the following embodiments, when a reference is made to the shapes, positional relationships, or the like of the constitutional elements, or the like, it is understood that they include ones substantially analogous or similar to the shapes or the like, unless otherwise specified, and unless otherwise considered apparently in principle, or except for other cases. This also applies to the foregoing number, and the like (including number, numerical value, quantity, range, or the like).

Below, the embodiments will be described in details by reference to the accompanying drawings. Incidentally, in all the drawings for describing the embodiments, the members having the same function are given the same or related reference signs and numerals, and a repeated description thereon is omitted. Further, when there are a plurality of similar members (portions), a reference sign may be added to the reference number of the generic name to indicate the individual or specific portion. Further, in the following embodiments, a description on the same or similar part will not be repeated in principle unless otherwise required.

Further, in the drawings for use in the embodiments, hatching may be omitted even in cross section for ease of understanding of the drawing. Whereas, hatching may be added even in plan view for ease of understanding of the drawing.

Further, in a cross sectional view and a plan view, the dimensions of each portion are not intended to correspond to those of an actual device. For ease of understanding of the drawing, a specific portion may be shown on a relatively larger scale. Further, also when a cross sectional view and a plan view correspond to each other, for ease of understanding of the drawings, a specific portion may be shown on a relatively larger scale.

Embodiment

Configuration of Semiconductor Device in Accordance With the Present Embodiment

The configuration of a semiconductor device in accordance with the present embodiment will be described by reference to FIGS. 1 to 3A to 3C.

Figure 2:
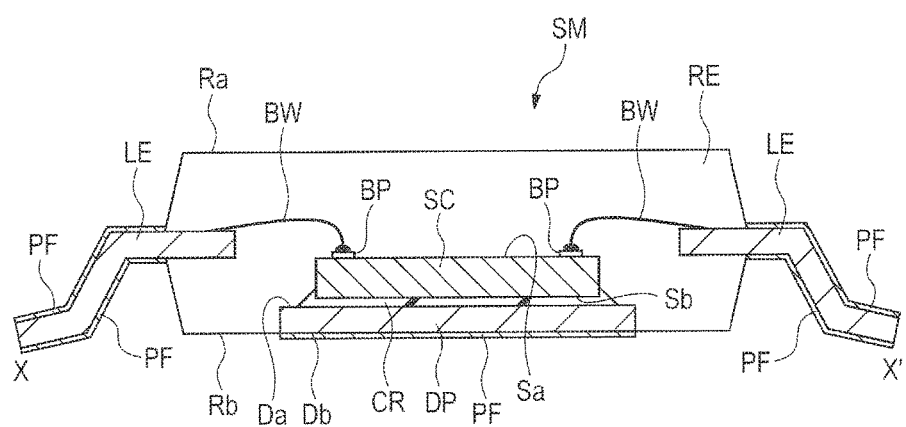
FIG. 2 is a cross sectional view along line X-X' of FIG. 1.
Figure 3A:
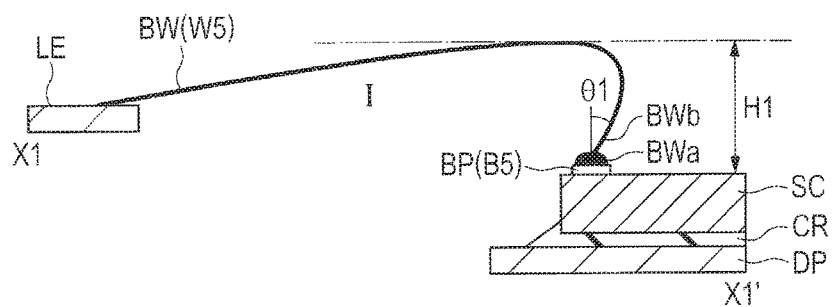
FIG. 3A is a cross sectional view along line X1-X1' of FIG. 1.
Figure 3B:
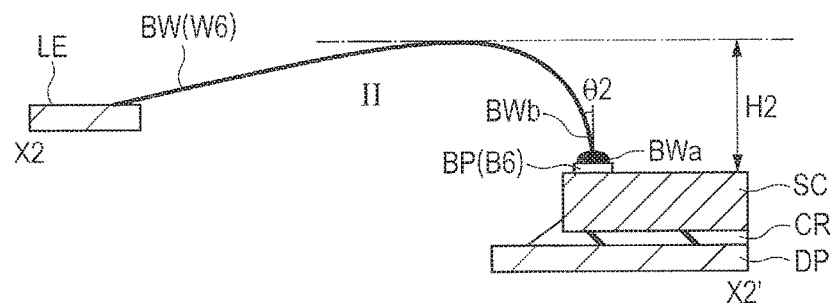
FIG. 3B is a cross sectional view along line X2-X2' of FIG. 1.
Figure 3C:
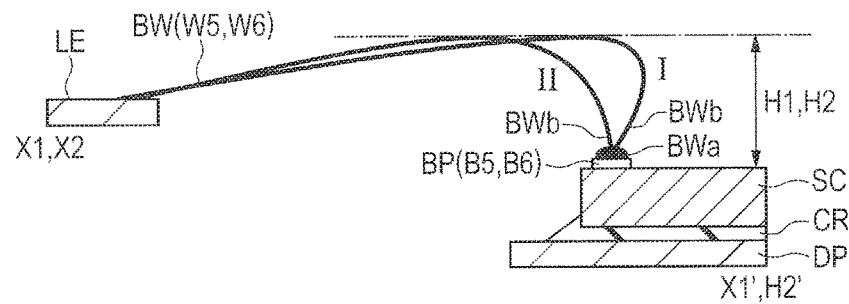
FIG. 3C is a cross sectional view resulting from superimposition of the cross section along the line X1-X1' of FIG. 1 and the cross section along the line X2-X2' of FIG. 1.

FIG. 1 is a top view of the semiconductor device in accordance with the present embodiment. FIG. 2 is a cross sectional view along line X-X' of FIG. 1. FIG. 3A is a cross sectional view along line X1-X1' of FIG. 1. FIG. 3B is a cross sectional view along line X2-X2' of FIG. 1. FIG. 3C is a cross sectional view resulting from superimposition of the cross section along the line X1-X1' of FIG. 1 and the cross section along the line X2-X2' of FIG. 1. Incidentally, FIG. 1 shows the state as seen through a sealing body. Further, in FIG. 1, terminals are shown in a reduced number for ease of understanding of the drawing. The number of the terminals is a number such as more than 100.

As shown in FIGS. 1 and 2 a semiconductor device SM accordance with the present embodiment has a die pad (tab or chip mounting part) DP, a plurality of suspended leads (supporting leads) HL, a plurality of leads (external terminals) LE, a semiconductor chip SC, a plurality of bonding wires (conductive wires or wires) BW, and a sealing body (sealing resin) RE.

Particularly, the die pad DP has a quadrangle, and has an upper surface (chip mounting surface) Da for mounting the semiconductor chip SC thereover, and a lower surface (exposed surface) Db opposite to the upper surface Da. Then, the lower surface Db of the die pad DP is exposed from the lower surface (mounting surface) Rb of the sealing body RE.

The suspended leads HL are connected with the four corner parts of the die pad DP, respectively, thereby to support the die pad DP.

Respective parts (inner leads or inner parts) of the leads LE are covered with the sealing body RE. In other words, the other parts (outer leads or outer parts) of the leads LE are exposed from the sealing body RE. Then, the portions (the other parts, outer leads, or outer parts) of the leads LE exposed from the sealing body RE protrude from four directions respectively perpendicular to the directions along the four sides of the die pad DP, and further are bent from the upper surface Ra side toward the lower surface Rb side of the sealing body RE. Namely, the semiconductor device SM is a surface mounting type semiconductor device, a so-called QHP or HQFP whose outside shape is a quadrangle, and from whose four side surfaces the other parts (outer leads or outer parts) of a plurality of leads LE in a gull wing shape protrude, and at whose bottom surface the lower surface of the die pad DP is exposed.

The semiconductor chip SC has a quadrangle, a main surface (first main surface or front surface) Sa, and a back surface (second main surface) Sb opposite to the main surface Sa. Namely, the semiconductor chip SC has, in plan view, a first side S1, a second side S2 facing to the first side S1, a third side S3 crossing each of the first side S1 and the second side S2, and a fourth side S4 crossing each of the first side S1 and the second side S2, and facing to the third side S3. Further, the semiconductor chip SC has a first corner part C1 at which the first side S1 and the third side S3 intersect with each other, a second corner part C2 at which the second side S2 and the fourth side S4 intersect with each other, a third corner part C3 at which the third side S3 and the second side S2 intersect with each other, and a fourth corner part C4 at which the fourth side S4 and the first side S1 intersect with each other.

With the back surface Sb of the semiconductor chip SC facing to the upper surface Da of the die pad DP, the semiconductor chip SC is arranged on the upper surface Da of the die pad DP via a die bonding material (adhesive) CR. On the main surface Sa side of the semiconductor chip SC, an integrated circuit is formed which includes, for example, a plurality of semiconductor elements, and multilayer wiring including insulation layers and wiring layers stacked in a plurality of stages, respectively, therein, and a surface protective film formed in such a manner as to cover the multilayer wiring. Incidentally, the die bonding material CR includes, for example, a paste-like or film-like conductive member. Alternatively, a die bonding material formed of a non-conductive member (e.g., resin material) may be used. Use of the conductive member can improve the heat radiation property of the semiconductor chip SC.

On the main surface Sa side of the semiconductor chip SC, further, a plurality of electrode pads (bonding pads or surface electrodes) BP are formed. The plurality of electrode pads BP each include the uppermost-layer wire (e.g., aluminum (Al)) of the multilayer wiring formed in the integrated circuit, and are exposed from the openings formed in the surface protective film, respectively.

A plurality of electrode pads BP include a first pad group G1 situated closer to the first side S1 than to the second side S2 of the semiconductor chip SC, and arranged along the first side S1, and a second pad group G2 situated closer to the second side S2 than to the first side S1 of the semiconductor chip SC, and arranged along the second side S2 in plan view. Further, a plurality of electrode pads BP include a third pad group G3 situated closer to the third side S3 than to the fourth side S4 of the semiconductor chip SC, and arranged along the third side S3, and a fourth pad group G4 situated closer to the fourth side S4 than to the third side S3 of the semiconductor chip SC, and arranged along the fourth side S4 in plan view.

Then, a plurality of electrode pads BP and respective parts of a plurality of leads LE are electrically connected with each other by a plurality of conductive members, respectively. The conductive member is a wire, namely, a bonding wire BW. The wire diameter thereof is, for example, about 15 μm to 20 μm. The bonding wire BW includes a material containing, for example, gold (Au) or copper (Cu) as the main component. However, when copper (Cu) is used for the bonding wire BW, as compared with the case where gold (Au) is used for the bonding wire BW, the junction part between the bonding wire BW and the electrode pad BP is more likely to be peeled in, for example, a reliability test, particularly, a temperature cycle test. For this reason, the bonding wire BW including a material containing gold (Au) as the main component is desirably used.

Further, on the lower surface Db of the die pad DP and the surface of the portion of each lead LE exposed from the sealing body RE, a plating film (plating layer) PF is formed. As a result, in the mounting step of the semiconductor device SM, the wettability (junction property) of the lower surface Db of the die pad DP and the port on of the lead LE exposed from the sealing body RE can be improved. Namely, it is possible to improve the wettability of the bonding material including a conductive member (solder material) used for electrically connecting the lower surface Db of the die pad DP and the portion of the lead LE exposed from the sealing body RE and the electrode pads of a mounting substrate (mother board), respectively, on each of the lower surface Db of the die pad DP and the portion of the lead LE exposed from the sealing body RE.

Incidentally, the die pad DP is not necessarily required to be bonded with the electrode pad of the mounting substrate. However, when the heat radiation property of the semiconductor device SM is desired to be improved, or when the die pad DP is used as the path for a signal or power supply (power supply potential or reference potential), preferably, an electrode pad adaptable to the die pad DP is provided on the mounting substrate, so that the electrode pad of the mounting substrate and the die pad DP are electrically connected with each other via a bonding material.

Then, the configuration of the bonding wire BW will be described in more details.

As described previously, on the main surface Sa side of the semiconductor chip SC, a plurality of electrode pads BP are formed. Then, the plurality of electrode pads BP can be divided into the first pad group G1, the second pad group G2, the third pad group G3, and the fourth pad group G4 arranged along the first side S1, the second side S2, the third side S3, and the fourth side S4 of the semiconductor chip SC, respectively.

The loop shape of a first wire W1 to be connected with a first electrode pad B1 situated closest to the first corner part C1 of the semiconductor chip SC of the plurality of electrode pads BP included in the first pad group G1 is different from the loop shape of a second wire W2 to be connected with a second electrode pad B2 situated closest to the fourth corner part C4 of the semiconductor chip SC.

Further, the loop shape of a third wire W3 to be connected with a third electrode pad B3 situated closest to the second corner part C2 of the semiconductor chip SC of the plurality of electrode pads BP included in the second pad group G2 is different from the loop shape of a fourth wire W4 to be connected with a fourth electrode pad B4 situated closest to the third corner part C3 of the semiconductor chip SC.

Further, the loop shape of a fifth wire W5 to be connected with a fifth electrode pad B5 situated closest to the first corner part C1 of the semiconductor chip SC of the plurality of electrode pads BP included in the third pad group G3 is different from the loop shape of a sixth wire W6 to be connected with a sixth electrode pad B6 situated closest to the third corner part C3 of the semiconductor chip SC.

Further, the loop shape of a seventh wire W7 to be connected with a seventh electrode pad B7 situated closest to the second corner part C2 of the semiconductor chip SC of the plurality of electrode pads BP included in the fourth pad group G4 is different from the loop shape of an eighth wire W8 to be connected with an eighth electrode pad B8 situated closest to the fourth corner part C4 of the semiconductor chip SC.

Additionally, when in plan view, the main surface Sa of the semiconductor chip SC is divided by a first virtual line IL1 dividing the first side S1 and the second side S2 of the semiconductor chip SC into two equal parts, respectively, and a second virtual line IL2 dividing the third side S3 and the fourth side S4 of the semiconductor chip SC into two equal parts, respectively, the main surface Sa of the semiconductor chip SC is divided into four regions. Namely, the main surface Sa of the semiconductor chip SC has a first region A1 including the first corner part C1 of the semiconductor chip SC, a second region A2 including the second corner part C2 of the semiconductor chip SC, a third region A3 including the third corner part C3 of the semiconductor chip SC, and a fourth region A4 including the fourth corner part C4 of the semiconductor chip SC.

Then, the loop shape of the first wire W1 to be connected with the first electrode pad B1 situated closest to the first corner part C1 of the semiconductor chip SC of the plurality of electrode pads BP included in the first pad group G1 is different from each loop shape of the plurality of bonding wires BW to be respectively connected with the plurality of electrode pads BP situated in the fourth region A4. Further, each loop shape of the plurality of bonding wires BW to be respectively connected with the plurality of electrode pads BP situated in the first region A1 of the plurality of electrode pads BP included in the first pad group G1 is different from each loop shape of the plurality of bonding wires BW to be respectively connected with the plurality of electrode pads BP situated in the fourth region A4.

Whereas, the loop shape of the third wire W3 to be connected with the third electrode pad B3 situated closest to the second corner part C2 of the semiconductor chip SC of the plurality of electrode pads BP included in the second pad group G2 is different from each loop shape of the plurality of bonding wires BW to be respectively connected with the plurality of electrode pads BP situated in the third region A3. Further, each loop shape of the plurality of bonding wires BW to be respectively connected with the plurality of electrode pads BP situated in the second region A2 of the plural ty of electrode pads BP included in the second pad group G2 is different from each loop shape of the plurality of bonding wires BW to be respectively connected with the plurality of electrode pads BP situated in the third region A3.

Further, the loop shape of the fifth wire W5 to be connected with the fifth electrode pad B5 situated closest to the first corner part C1 of the semiconductor chip SC of the plurality of electrode pads BP included in the third pad group G3 is different from each loop shape of the plurality of bonding wires BW to be respectively connected with the plurality of electrode pads BP situated in the third region A3. Further, each loop shape of the plurality of bonding wires BW to be respectively connected with the plurality of electrode BP situated in the first region A1 of the plurality of electrode pads BP included in the third pad group G3 is different from each loop shape of the plurality of bonding wires BW to be respectively connected with the plurality of electrode pads BP situated in the third region A3.

Still further, the loop shape of the seventh wire W7 to be connected with the seventh electrode pad B7 situated closest to the second corner part C2 of the semiconductor chip SC of the plurality of electrode pads BP included in the fourth pad group G4 is different from each loop shape of the plurality of bonding wires BW to be respectively connected with the plurality of electrode pads BP situated in the fourth region A4. Further, each loop shape of the plurality of bonding wires BW to be respectively connected with the plurality of electrode pads BP situated in the second region A2 of the plurality of electrode pads BP included in the fourth pad group G4 is different from each loop shape of the plurality of bonding wires BW to be respectively connected with the plurality of electrode pads BP situated in the fourth region A4.

The plurality of bonding wires BW are connected with the plurality of electrode pads BP, and respective parts of the plurality of leads LE, respectively, using a forward bonding method. Namely, after connecting the electrode pad BP formed on the main surface Sa side of the semiconductor chip SC and a part of the bonding wire BW, a part of the lead LE and the other part of the bonding wire BW are connected with each other.

As shown in FIGS. 3A and 3B, the bonding wire BW to be connected with the electrode pad BP has a ball part BWa in contact with the electrode pad BP, and a core part BWb connected to the ball part BWa.

Then, as shown in FIG. 3A, in the fifth wire W5, at the junction part (neck part) between the ball part BWa and the core part BWb connected with the ball part BWa, the core part BWb is led out from the junction part in the inward direction of the semiconductor chip SC. In other words, in the fifth wire W5, at the junction part (neck part) between the ball part BWa and the core part BWb connected with the ball part BWa, the core part BWb is led out in the direction opposite to the lead LE to be connected with the fifth wire W5.

On the other hand, as shown in FIG. 3B, in the sixth wire W6, at the junction part (neck part) between the ball part BWa and the core part BWb connected with the ball part BWa, the core part BWb is led out in the nearly immediately upward direction of the junction part.

Therefore, as shown in FIGS. 3A and 3B, the bending angle $\theta 1$ is larger than the bending angle $\theta 2$, where $\theta 1$ denotes the bending angle of the core part BWb with respect to the direction of the normal at the junction part (neck part) between the ball part BWa and the core part BWb at the fifth wire W5, and $\theta 2$ denotes the bending angle of the core part BWb with respect to the direction of the normal at the junction part (neck part) between the ball part BWa and the core part BWb at the sixth wire W6.

Further, as shown in FIG. 3C, the fifth wire W5 is longer than the sixth wire W6.

However, for example, as shown in FIG. 3C, the loop height H1 of the fifth wire W5 from the electrode pad BP (or the main surface of the semiconductor chip SC) is equal to the loop height H2 of the sixth wire W6 from the electrode pad BP (or the main surface of the semiconductor chip SC).

Although a description by reference to the drawing is herein omitted, the first wire W1, the third wire W3, and the seventh wire W7 each have the same loop shape as that of the fifth wire W5. Further, the second wire W2, the fourth wire W4, and the eighth wire W8 each have the same loop shape as that of the sixth wire W6.

Therefore, the bending angle of each core part of the first wire W1, the third wire W3, the fifth wire W5, and the seventh wire W7 is larger than the bending angle of each core part of the second wire W2, the fourth wire W4, the sixth wire W6, and the eighth wire W8.

Whereas, each length of the first wire W1, the third wire W3, the fifth wire W5, and the seventh wire W7 is longer than each length of the second wire W2, the fourth wire W4, the sixth wire W6, and the eighth wire W8.

However, each height of the first wire W1, the third wire W3, the fifth wire W5, and the seventh wire W7 from their respective electrode pads BP is equal to each loop height of the second wire W2, the fourth wire W4, the sixth wire W6, and the eighth wire W8 from their respective electrode pads BP.

As a result, for example, as shown in FIG. 1, the first wire W1, the third wire W3, the fifth wire W5, and the seventh wire W7 may extend, in plan view, in the inward direction of the semiconductor chip SC beyond the junction part (neck part) between the ball part BWa and the core part BWb connected with the ball part BWa.

Method For Manufacturing Semiconductor Device in Accordance With the Present Embodiment A method for manufacturing a semiconductor device in accordance with the present embodiment will be described by reference to FIGS. 4A and 4B to 11A and 11B.

Figure 4A:
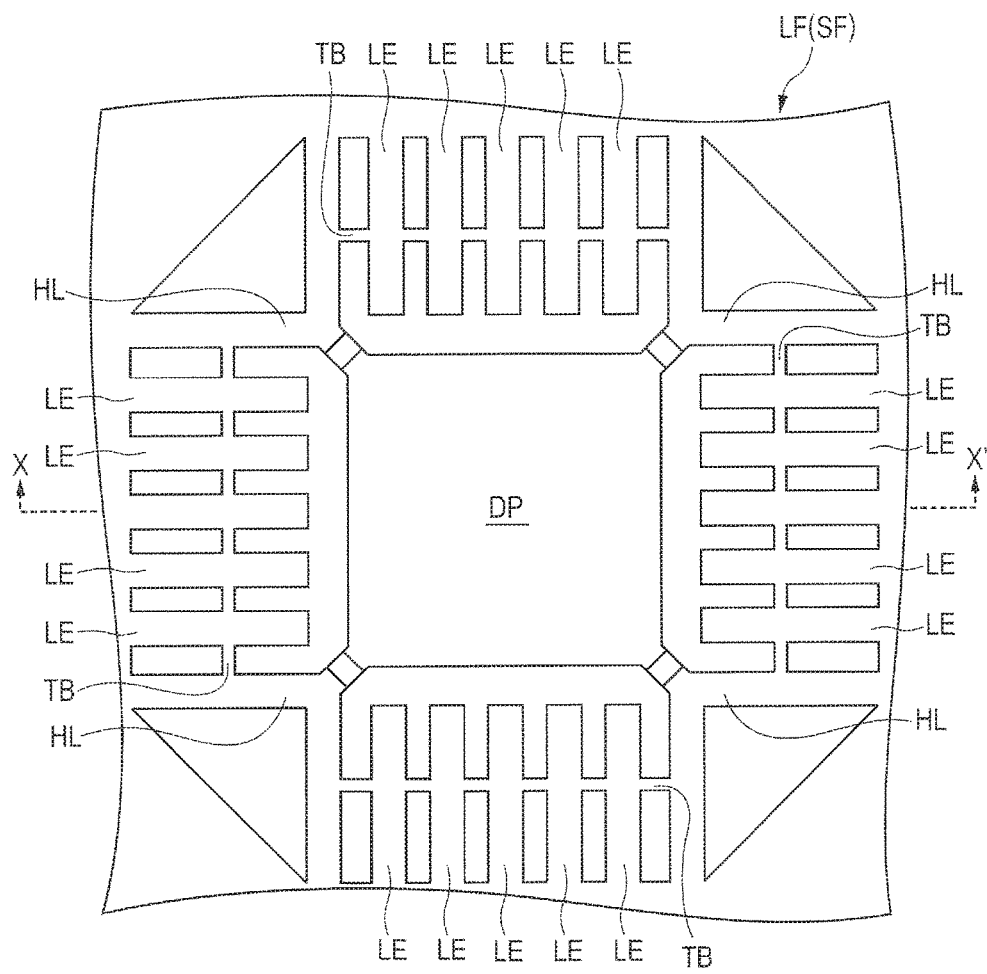
FIGS. 4A and 4B are a plan view and a cross sectional view, respectively, each showing one example of a lead frame (unit frame) in accordance with an embodiment.
Figure 4B:
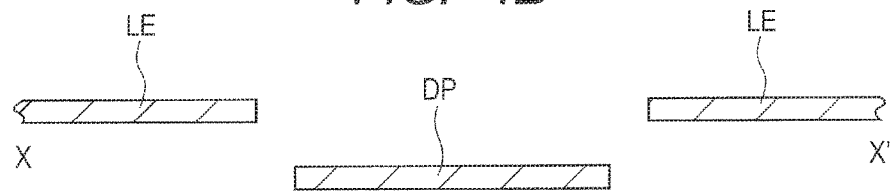
Figure 5A:
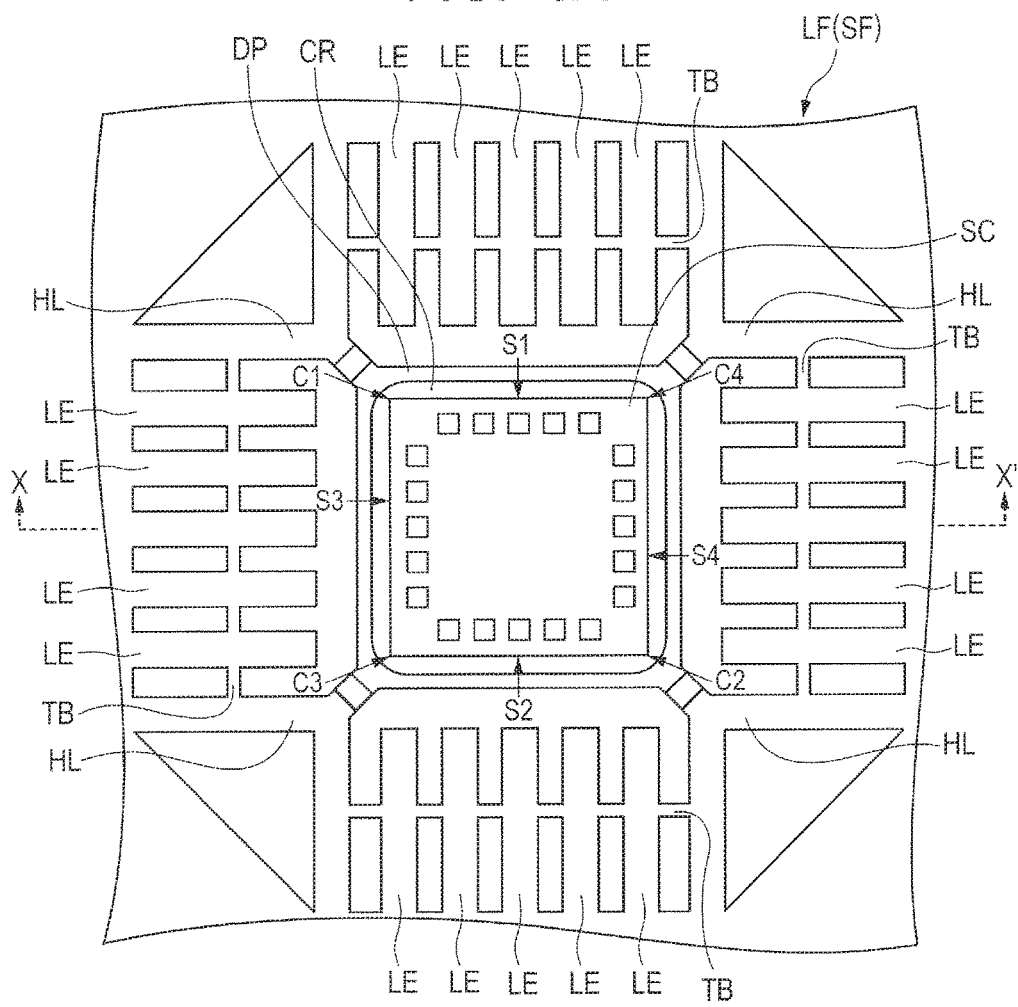
FIGS. 5A and 5B are a plan view and a cross sectional view, respectively, each showing the semiconductor device in a die bonding step in accordance with an embodiment.
Figure 5B:
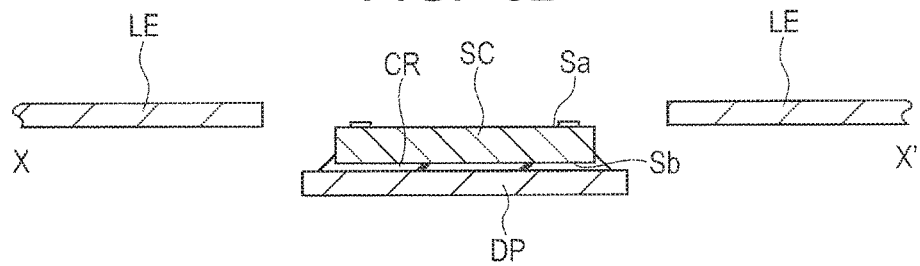
Figure 6A:
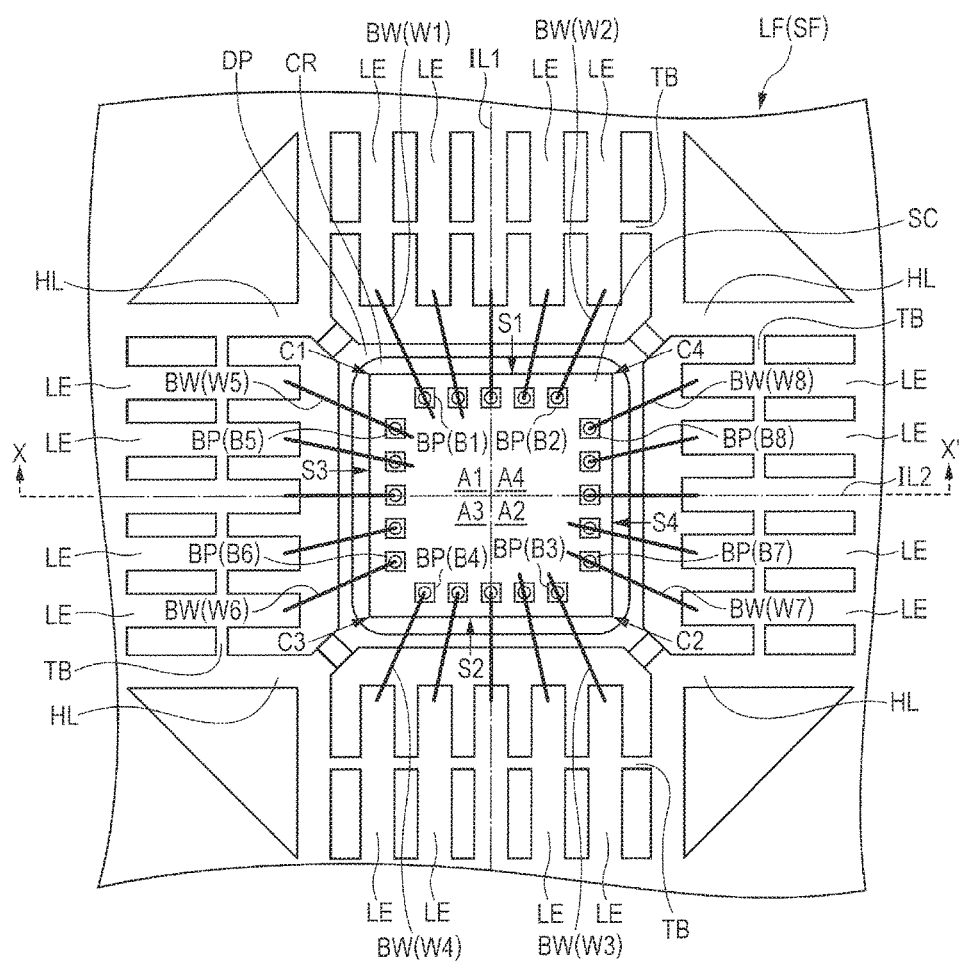
FIGS. 6A and 6B are a plan view and a cross sectional view, respectively, each showing the semiconductor device in a wire bonding step in accordance with an embodiment.
Figure 6B:
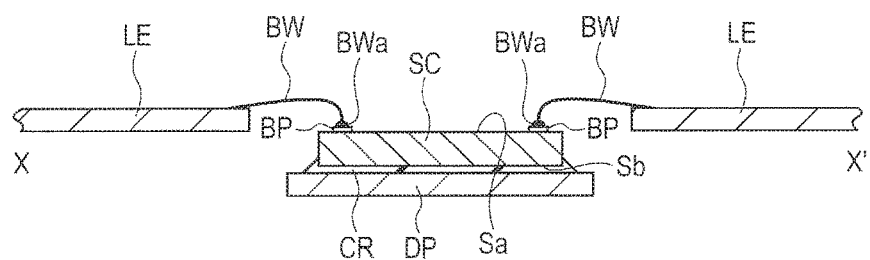
Figure 7:
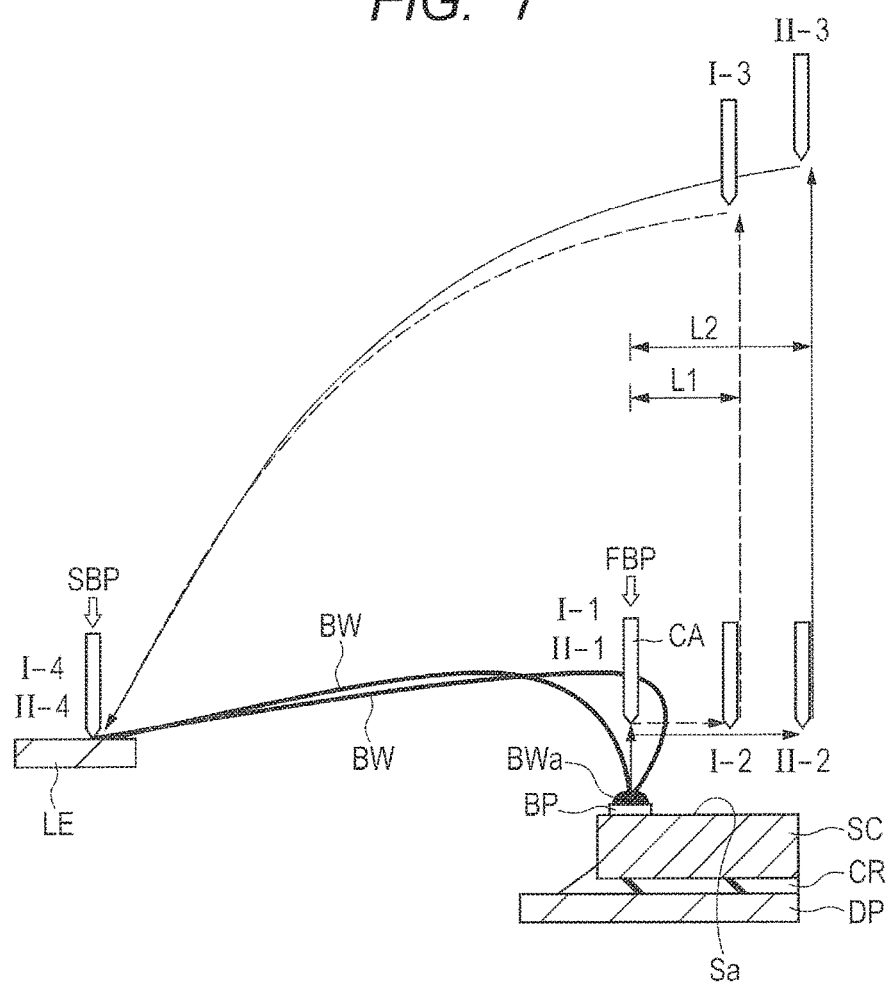
FIG. 7 is a schematic view for illustrating one example of the locus of a capillary in accordance with an embodiment.
Figure 8A:
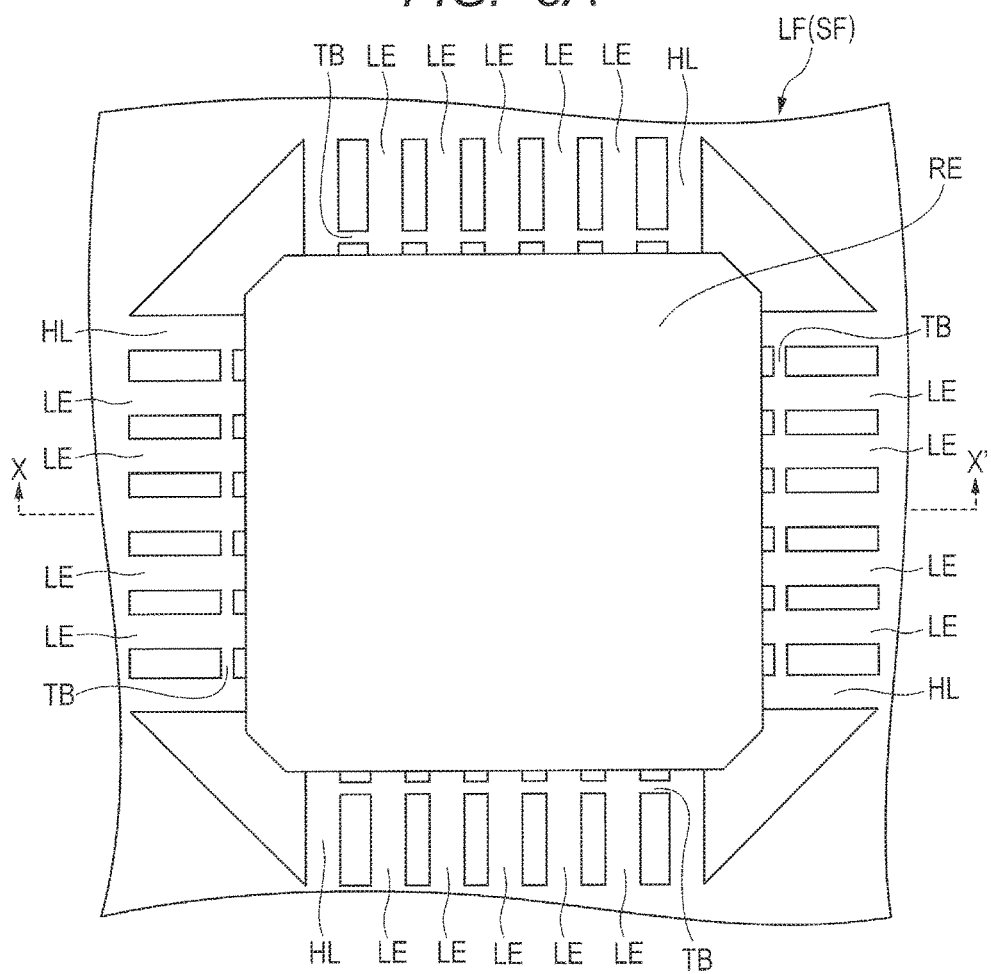
FIGS. 8A and 8B are a plan view and a cross sectional view, respectively, each showing the semiconductor device in a molding step in accordance with an embodiment.
Figure 8B:
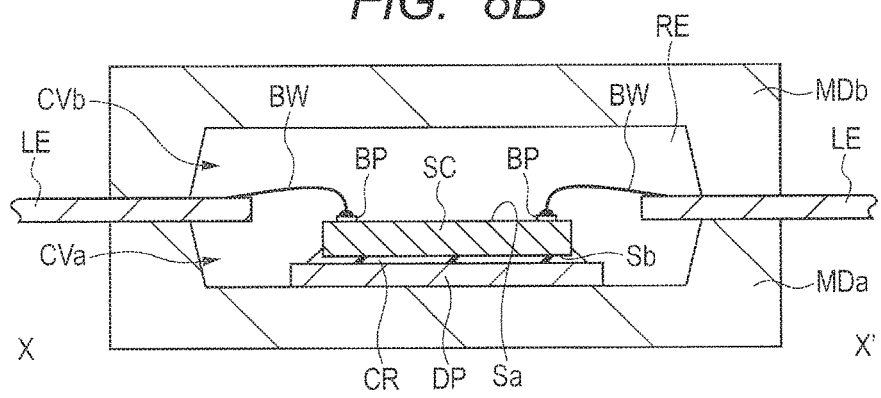
Figure 9:
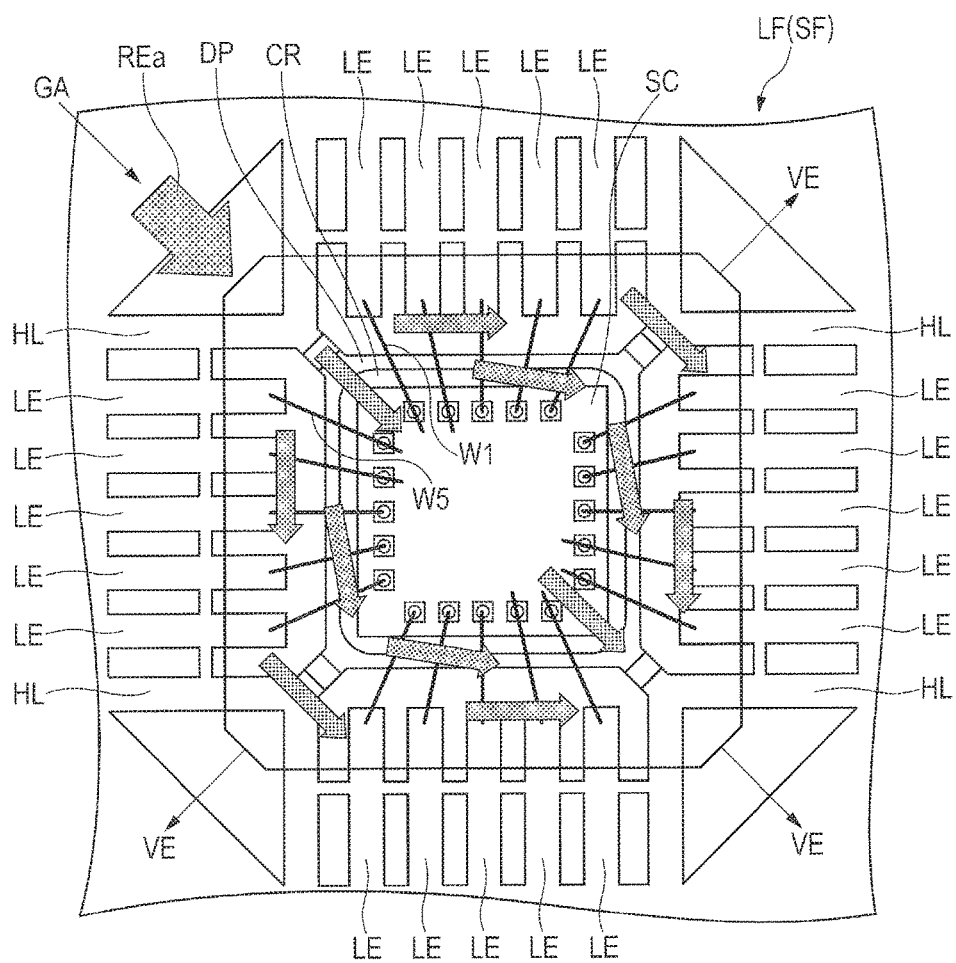
FIG. 9 is a plan view showing the flow of a resin in the molding step in accordance with an embodiment.
Figure 11A:
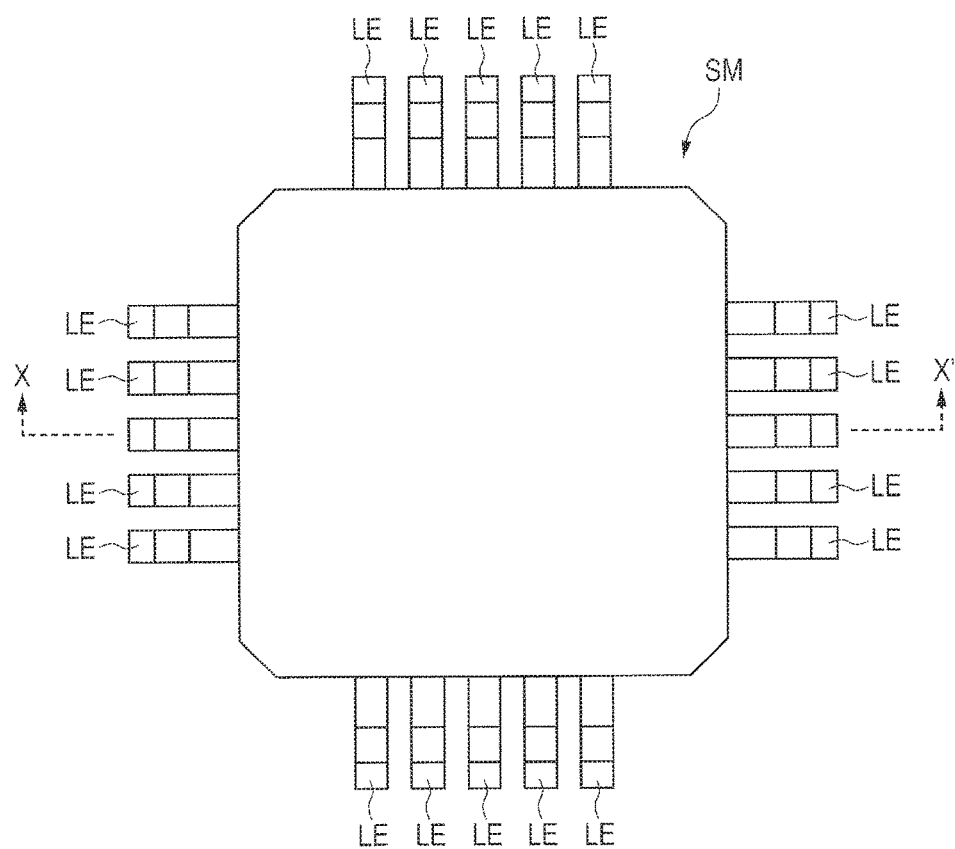
FIGS. 11A and 11B are a plan view and a cross sectional view, respectively, each showing the semiconductor device in a lead formation step in accordance with an embodiment.
Figure 11B:
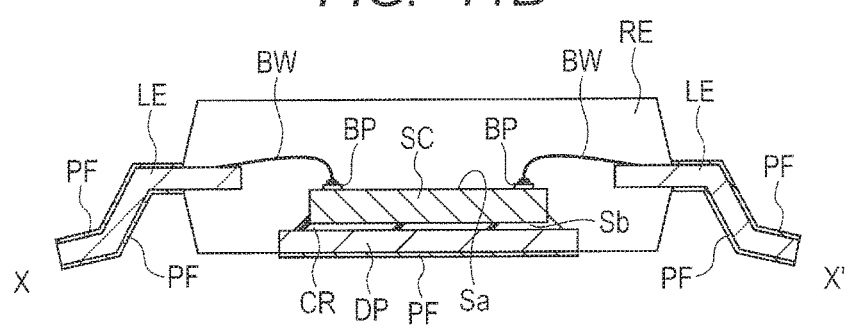

FIGS. 4A and 4B are a plan view and a cross sectional view, respectively, each showing one example of the lead frame (unit frame) in accordance with the present embodiment. FIGS. 5A and 5B are a plan view and a cross sectional view, respectively, each showing the semiconductor device in a wire bonding step in accordance with the present embodiment. FIGS. 6A and 6B are a plan view and a cross sectional view, respectively, each showing the semiconductor device in a die bonding step in accordance with the present embodiment. FIG. 7 is a schematic view for illustrating one example of the locus of a capillary in accordance with the present embodiment. FIGS. 8A and 8B are a plan view and a cross sectional view, respectively, each showing the semiconductor device in a molding step in accordance with the present embodiment. FIG. 9 is a plan view for illustrating the flow of a resin in the molding step in accordance with the present embodiment. FIGS. 10A and 10B are a plan view and a cross sectional view, respectively, each showing the semiconductor device in a lead cutting step in accordance with the present embodiment. FIGS. 11A and 11B are a plan view and a cross sectional view, respectively, each showing the semiconductor device in a lead molding step.

Incidentally, in FIGS. 4A and 4B to 6A and 6B, 8A and 8B, 10A and 10B, and 11A and 11B for use in description of one example of a method for manufacturing a semiconductor device, only the region corresponding to one unit frame SF is shown. Further, FIG. 9 shows the state as seen through a molding mold, where in the drawing, an arrow indicated with a shaded hatching indicates the flow of a resin.

1. Semiconductor Chip Provision Step

An integrated circuit is formed on the circuit formation surface of a semiconductor wafer. The integrated circuit is formed on a per chip unit basis at the semiconductor wafer according to a prescribed manufacturing process in a manufacturing step referred to as a pre-step or a diffusion step. Subsequently, whether each semiconductor chip formed on the semiconductor wafer is good or bad is determined. Then, the semiconductor wafer is diced, thereby to be singulated into respective semiconductor chips.

The semiconductor chip has a main surface, and a back surface opposite to the main surface. Over the main surface of the semiconductor chip, a plurality of electrode pads are formed to be exposed from an insulation film.

2. Base Material (Lead Frame) Provision Step

A lead frame (wiring board or wiring member) LF is provided which has a first surface (upper surface or front surface), and a second surface (lower surface or back surface) opposite to the first surface, and which is a framework made of a metal containing for example, copper (Cu) as the main material.

As shown in FIGS. 4A and 4B, the lead frame LF includes unit frames SF corresponding to one semiconductor product arranged in a plurality of rows and and a plurality of columns, a so-called matrix, for example, when a first direction of the lead frame LF is a column, and a second direction orthogonal to the column is a row.

At respective central parts of the plurality of unit frames SF present at the first surface of the lead frame LF, a substantially quadrangle die pad DP for mounting a semiconductor chip thereover is provided. The die pad DP is integrally connected with the lead frame LF via suspended leads HL. The suspended leads HL for supporting the die pad DP are joined with the four corner parts of the die pad DP, respectively.

Whereas, a plurality of leads LE are provided facing to the four sides of the die pad DP not joined with the suspended leads HL, respectively, and apart from the four sides. The plurality of leads LE are connected by tie bars TB respectively extending in the first direction or the second direction. Further, although not shown, a plurality of holes for positioning the lead frame LF, or for relaxing the distortion of the lead frame LF associated with resin sealing are provided in the periphery of the lead frame LF.

3. Die Bonding Step

As shown in FIGS. 5A and 5B, on the upper surface of each die pad DP of the plurality of unit frames SF (the first surface of the lead frame LF), a semiconductor chip SC determined as a good product is mounted. At this step, the upper surface of the die pad DP and the back surface Sb of the semiconductor chip SC are joined using a die bonding material CR such as a paste-Like adhesive (e.g., silver (Ag) paste). Incidentally, joining between the upper surface of the die pad DP and the back surface Sb of the semiconductor chip SC is not limited to joining by the paste-like adhesive. For example, joining using gold-tin (Au—Sn) eutectic is also acceptable.

The semiconductor chip SC has, as described previously, a quadrangle, and has the main surface Sa and the back surface Sb opposite to the main surface Sa. Namely, the semiconductor chip SC has, in plan view, the first side S1, the second side S2 facing to the first side S1, the third side S3 crossing each of the first side S1 and the second side S2, and the fourth side S4 crossing each of the first side S1 and the second side S2, and facing to the third side S3. Further, the semiconductor chip SC has the first corner part C1 at which the first side S1 and the third side S3 intersect with each other, the second corner part C2 at which the second side S2 and the fourth side S4 intersect with each other, the third corner part C3 at which the third side S3 and the second side S2 intersect with each other, and the fourth corner part C4 at which the fourth side S4 and the first side S1 intersect with each other.

4. Wire Bonding Step

As shown in FIGS. 6A and 6B, for example, by a nail head bonding (ball bonding) method using thermocompression and ultrasonic vibration in combination, the plurality of electrode pads BP formed on the main surface Sa of the semiconductor chip SC and the plurality of leads LE are electrically connected with each other using a plurality of conductive members such as bonding wires BW, respectively. Specifically, the tip of the bonding wire BW is molten by arc discharge, thereby to form a ball part BWa by surface tension. The resulting ball part BWa is thermally compressed to the electrode pad BP and the lead LE by a capillary (i.e., a cylindrical coupling jig) while applying an ultrasonic vibration of, for example, 120 kHz thereto.

As the materials for the bonding wire BW, mention may be made of metal materials such as gold (Au), copper (Cu), and aluminum (Al). In the case of gold (Au), for example, a gold (Au) wire with a diameter of 15 μm to 20 μm is often used.

Further, as shown in FIG. 7, for the wire bonding step, there is used the forward bonding method, namely, a method in which after connecting the electrode pad BP formed on the main surface Sa of the semiconductor chip SC and a part of the bonding wire BW, the lead LE and the the other part of the bonding wire BW are connected.

Herein, as shown in FIG. 6A, for the first wire W1 and the fifth wire W5 to be connected with the first electrode pad B1 and the fifth electrode pad B5, respectively, situated closest to the first corner part C1 of the plurality of electrode pads BP formed on the main surface Sa of the semiconductor chip SC, the second wire bonding method (the loci of II-1, II-2, II-3, and II-4) shown in FIG. 7 is used. Further, not limited to the first wire W1 and the fifth wire W5, the second bonding method shown in FIG. 7 may also be used for, for example, the bonding wires BP respectively connected with the electrode pad BP situated adjacent to the first electrode pad B1 along the first side S1, and the electrode pad BP situated adjacent to the third electrode pad B3 along the third side S3.

Whereas, for the third wire W3 and the seventh wire W7 to be connected with the third electrode pad B3 and the seventh electrode pad B7, respectively, situated closest to the second corner part C2 facing to the first corner part C1 across the center of the semiconductor chip SC of the plurality of electrode pads BP formed on the main surface Sa of the semiconductor chip SC, the second wire bonding method (the loci of II-1, II-2, II-3, and II-4) shown in FIG. 7 is used. Further, not limited to the third wire W3 and the seventh wire W7, the second bonding method shown in FIG. 7 may also be used for, for example, the bonding wires BP respectively connected with the electrode pad BP situated adjacent to the third electrode pad B3 along the second side S2, and the electrode pad BP situated adjacent to the seventh electrode pad B7 along the fourth side S4.

In contrast, for the fourth wire W4 and the sixth wire W6 to be connected with the fourth electrode pad B4 and the sixth electrode pad B6, respectively, situated closest to the third corner part C3 of the plurality of electrode pads BP formed on the main surface Sa of the semiconductor chip SC, the first wire bonding method (the loci of I-1, I-2, I-3, and I-4) shown in FIG. 7 is used.

Further, for the second wire W2 and the eighth wire W8 to be connected with the second electrode pad B2 and the eighth electrode pad B8, respectively, situated closest to the fourth corner part C4 facing to the third corner part C3 across the center of the semiconductor chip SC of the plurality of electrode pads BP formed on the main surface Sa of the semiconductor chip SC, the first wire bonding method (the loci of I-1, I-2, I-3, and I-4) shown in FIG. 7 is used.

Additionally, as shown in FIG. 6A, when the main surface Sa of the semiconductor chip SC is divided by a first virtual line IL1 dividing the first side S1 and the second side S2 of the semiconductor chip SC into two equal parts, respectively, and a second virtual line IL2 dividing the third side S3 and the fourth side S4 of the semiconductor chip SC into two equal parts, respectively, in plan view, the main surface Sa of the semiconductor chip SC is divided into four regions. Namely, the main surface Sa of the semiconductor chip SC has a first region A1 including the first corner part C1 of the semiconductor chip SC, a second region A2 including the second corner part C2 of the semiconductor chip SC, a third region A3 including the third corner part C3 of the semiconductor chip SC, and a fourth region A4 including the fourth corner part C4 of the semiconductor chip SC.

Then, for the plurality of bonding wires BW respectively connected with the plurality of electrode pads BP respectively situated in the first region A1 and the second region A2 of the plurality of electrode pads BP formed on the main surface Sa of the semiconductor chip SC, the second wire bonding method (the loci of II-1, II-2, II-3, and II-4) shown in FIG. 7 may be used.

In contrast, for the plurality of bonding wires BW respectively connected with the plurality of electrode pads BP respectively situated in the third region A3 and the fourth region A4 of the plurality of electrode pads BP formed on the main surface Sa of the semiconductor chip SC, the first wire bonding method (the loci of I-1, I-2, I-3, and I-4) shown in FIG. 7 is used.

Herein, the first wire bonding method (the loci of I-1, I-2, I-3, and I-4) will be described below by reference to FIG. 7.

First, from the state in which a ball is formed at the tip of the wire, a wire clamp is opened, so that a capillary CA moves downward. At this step, the ball is trapped in a chamfer, and is aligned with the center of the tip surface of the capillary CA.

Then, the capillary CA is moved downward, so that the ball is brought into contact with the electrode pad BP formed on the main surface Sa of the semiconductor chip SC. Then, a heat, a load, and an ultrasonic wave are applied to the ball, thereby to bond the ball to the electrode pad BP, resulting in the formation of a ball part BWa (first bond or ball bond).

Then, the capillary CA is moved upward from the electrode pad BP bonded with the ball part BWa to a given height. Then, the capillary CA is moved to the lead LE to be connected with the wire while forming the wire into a loop.

Then, the wire is brought into contact with the lead LE. Then, a heat, a load, and an ultrasonic wave are applied to the wire, thereby to bond the wire and the lead LE (second bond or stitch bond).

Then, the capillary CA moves upwards while leaving the wire. After ensuring a given length of tail at the tip of the capillary CA, the wire clamp is closed, thereby to cut the wire. As a result, the bonding wire BW is formed.

In order to form the wire into a loop in a desired shape between bonding of the ball with the electrode pad BP at the first bonding point FBP and bonding of the wire with the lead LE at the second bonding paint SBP, the capillary CA is moved along a specific locus, thereby to be operated to "reform" the wire.

For example, as shown in FIG. 7, after pulling the capillary CA from the electrode pad BP (first bonding point FBP) immediately upwardly (I-1), the capillary CA is moved in the inward direction of the semiconductor chip SC, namely, in the direction opposite to the lead LE to be connected with the wire (I-2). L1 denotes the moving distance of the capillary CA from the first bonding point FBP in plan view at this step. Subsequently, after pulling the capillary CA immediately still more upwardly (I-3), the capillary CA is moved toward the lead LE to be connected with the wire while being moved downwardly, thereby to press the wire onto the lead LE (second bonding point SBP) (I-4).

The second wire bonding method (the loci of II-1, II-2, II-3, and II-4) will be described by reference to FIG. 7 below.

The operations of connecting between the wire and the electrode pad BP formed on the main surface Sa of the semiconductor chip SC, and connecting between the wire and the lead LE in the second wire bonding method are basically equal to the operations of connecting between the wire and the electrode pad BP formed on the main surface Sa of the semiconductor chip SC, and connecting between the wire and the lead LE in the first wire bonding method.

Further, in order to form the wire into a loop in a desired shape between bonding of the ball with the electrode pad BP at the first bonding point FBP and bonding of the wire with the lead LE at the second bonding point SBP, the capillary CA is moved along a specific locus, thereby to be operated to "reform" the wire.

However, the locus of the capillary CA of the first wire bonding method and the locus of the capillary CA of the second wire bonding method are different from each other.

For example, as shown in FIG. 7, after pulling the capillary CA from the electrode pad BP (first bonding point FBP) immediately upwardly (II-1), the capillary CA is moved in the inward direction of the semiconductor chip SC, namely, in the direction opposite to the lead LE to be connected with the wire (II-2). L2 denotes the moving distance of the capillary CA from the first bonding point FBP in plan view at this step. The moving distance L2 of the second wire bonding method is larger than the moving distance L1 of the first wire bonding method. Subsequently, after pulling the capillary CA immediately still more upwardly (II-3), the capillary CA is moved toward the lead LE to be connected with the wire while being moved downwardly, thereby to press the wire onto the lead LE (second bonding point SBP) (II-4).

Therefore, the loop shape of the bonding wire BW formed using the first wire bonding method and the loop shape of the bonding wire BW using the second wire bonding method are different from each other.

Namely, each of the first wire W1, the third wire W3, the fifth wire W5, and the seventh wire W7 formed using the second wire bonding method is led out from the first bonding point FBP at which the ball part BWa is situated in the inward direction of the semiconductor chip SC (the direction opposite to the leads LE to be respectively connected with the first wire W1, the third wire W3, the fifth wire W5, and the seventh wire W7).

In contrast, each of the second wire W2, the fourth wire W4, the sixth wire W6, and the eighth wire W8 formed using the first wire bonding method is not led out from the first bonding point FBP at which the ball part BWa is situated in the inward direction of the semiconductor chip SC (the direction opposite to the leads LE to be respectively connected with the second wire W2, the fourth wire W4, the sixth wire W6, and the eighth wire W8).

Therefore, the bending angle of the core part of the first wire W1 is larger than the bending angle of the core part of the second wire W2. The bending angle of the core part of the third wire W3 is larger than the bending angle of the core part of the fourth wire W4. The bending angle of the core part of the fifth wire W5 is larger than the bending angle of the core part of the sixth wire W6. In addition, the bending angle of the core part of the seventh wire W7 is larger than the bending angle of the core part of the eighth wire W8 (see FIG. 3C).

Further, the first wire W1 is longer than the second wire W2. The third wire W3 is longer than the fourth wire W4. The fifth wire W5 is longer than the sixth wire W6. In addition, the seventh wire W7 is longer than the eighth wire W8 (see FIG. 3C).

Incidentally, in the foregoing description, the second wire bonding method was applied to the first wire W1 and the fifth wire W5 to be connected with the first electrode pad B1 and the fifth electrode pad B5 situated closest to the first corner part C1, respectively, and the third wire W3 and the seventh wire W7 to be connected with the third electrode pad B3 and the seventh electrode pad B7 situated closest to the second corner part C2, respectively. However, the present invention is not limited thereto.

Namely, the bonding wire BW to which the second wire bonding method is applied is determined in consideration of the flow of the resin in a molding step described later.

For example, as shown in FIG. 6A, the second wire bonding method is applicable to a plurality of bonding wires BW to be connected with the first electrode pad B1 situated closest to the first corner part C1, and the electrode pad BP situated adjacent to the first electrode pad B1 along the first side S1, respectively. Further, the second wire bonding method is applicable to a plurality of bonding wires BW to be connected with the fifth electrode pad B5 situated closest to the first corner part C1, and the electrode pad BP situated adjacent to the fifth electrode pad B5 along the third side S3, respectively. Still further, the second wire bonding method applicable to a plurality of bonding wires BW to be connected with the third electrode pad B3 situated closest to the second corner part C2, and the electrode pad BP situated adjacent to the third electrode pad B3 along the second side S2, respectively. Furthermore, the second wire bonding method is applicable to a plurality of bonding wires BW to be connected with the seventh electrode pad B7 situated closest to the second corner part C2, and the electrode pad BP situated adjacent to the seventh electrode pad B7 along the fourth side S4, respectively.

In contrast, the first wire bonding method is applicable to the electrode pads BP to which the second wire bonding method is not applied.

Additionally, for example, as shown in FIG. 6A, the second wire bonding method is applicable to a plurality of bonding wires BW to be respectively connected with the plurality of electrode pads BP situated in the first region A1 and the second region A2, respectively of the plurality of electrode pads BP formed on the main surface Sa of the semiconductor chip SC.

In contrast, the first wire bonding method is applicable to a plurality of bonding wires BW to be respectively connected with the plurality of electrode pads BP situated in the third region A3 and the fourth region A4, respectively of the plurality of electrode pads BP formed on the main surface Sa of the semiconductor chip SC.

However, the second wire bonding method is necessarily applied to the first wire W1 and the fifth wire W5 to be connected with the first electrode pad B1 and the fifth electrode pad B5, respectively, situated closest to the first corner part C1 of the semiconductor chip SC, and the third wire W3 and the seventh wire W7 to be connected with the third electrode pad B3 and the seventh electrode pad B7, respectively, situated closest to the second corner part C2 of the semiconductor chip SC.

Thus, using the first wire bonding method or the second wire bonding method, the plurality of bonding wires BW having mutually different loop shapes are formed. This can reduce the defective conditions of the bonding wires BW caused by the flow of the resin in the molding step. The defective conditions of the bonding wires BW include, for example, (1) peeling of the bonding wire BW from the electrode pad BP, (2) cutting of the junction part (neck part) between the ball part BWa and the core part BWb of the bonding wire BW, or (3) the sweep of the bonding wire BW.

Incidentally, the features and the effects of the semiconductor device in accordance with the present embodiment will be described in details in "Configuration and problems of semiconductor device by Comparative Example", and "Features and effects of a semiconductor device in accordance with the present embodiment".

5. Molding Step

As shown in FIGS. 8A and 8B, and FIG. 9, each of the plurality of semiconductor chip, SC mounted on the lead frame LF is resin sealed by a sealing body RE.

First, the lead frame LF including a plurality of wire-bonded semiconductor chips SC mounted thereover is set in a molding mold included in a transfer molding device.

The molding mold has a lower mold MDa over which the lead frame LF is arranged, and an upper mold MDb situated above the lower mold MDa, and to be engaged with the lower mold MDa for hermetically sealing the lead frame LF. The lead frame LF is arranged between the lower mold MDa and the upper mold MDb. The lower mold MDa and the upper mold MDb include a plurality of cavities CVa and cavities CVb each serving as a package region (or also referred to as a resin sealing region) for resin sealing the semiconductor chip SC, formed therein, respectively.

Further, a gate GA serving as the inlet for allowing the resin REa to flow therethrough into the cavities CVa and CVb is formed in each of the lower mold MDa and the upper mold MDb.

Figure 12A:
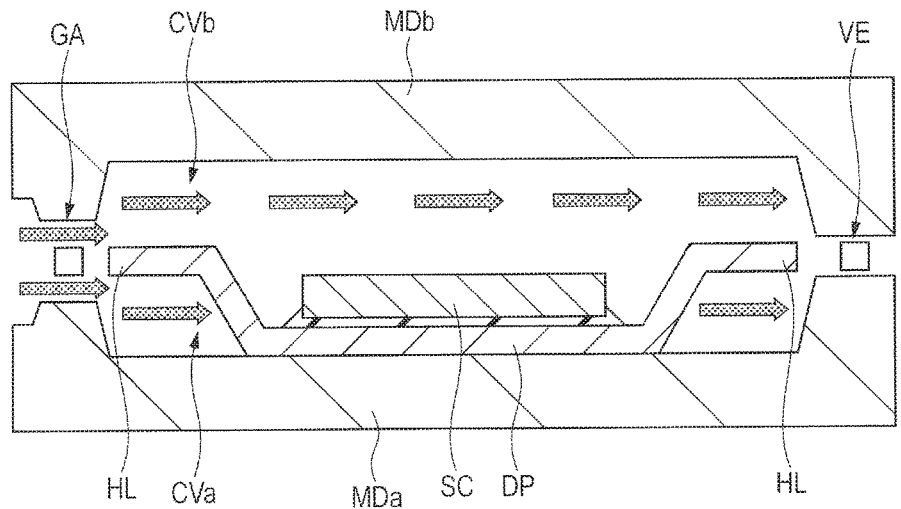
FIG. 12A is a cross sectional view for illustrating the flow of a resin from the gate into the vent in the molding step.
Figure 12B:
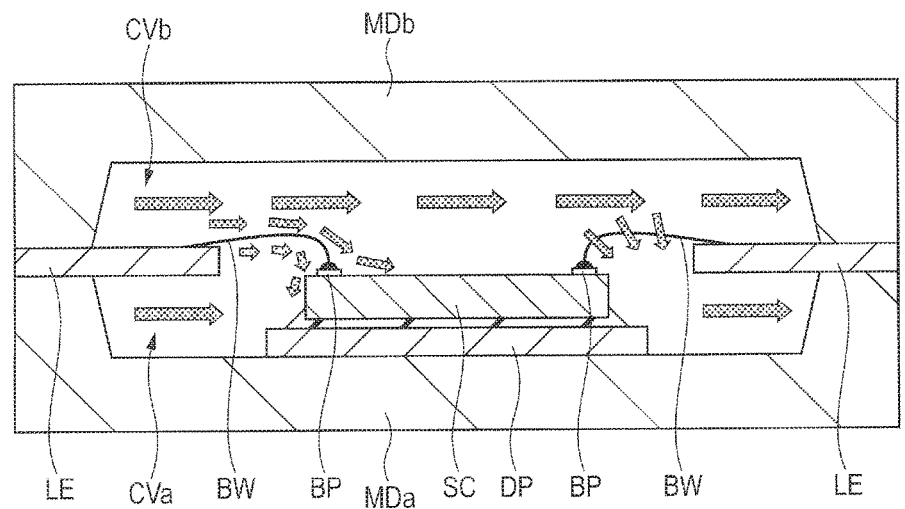
FIG. 12B is a cross sectional view for illustrating the flow of the resin in the periphery of the bonding wires respectively situated in the vicinity of the gate and in the vicinity of the vent in the molding step.

As shown in FIG. 9, the gate GA is provided in the vicinity of a given suspended lead HL (a suspended lead HL situated between the lead LE connected with the first wire W1 and the lead LE connected with the fifth wire W5) of the four suspended leads HL. As shown in FIGS. 12A and 12B, the resin REa is poured into the cavities CVa and CVb from a pot part (not shown) of the molding mold via the gates GA provided in the upper mold MDb (the upper side of the suspended lead HL) and the lower mold MDa (the lower side of the suspended lead HL), respectively. Further, vents (also referred to as air vents) VE are provided in the vicinity of the residual three suspended leads HL of the four suspended leads HL, respectively. Thus, the air or gas in the cavities CVa and CVb is exhausted through the vents VE provided at the upper molds MDb (on the upper side of the residual suspended leads HL) and the lower molds MDa (on the lower side of the residual suspended leads HL), respectively to outside the cavities CVa and CVb (see FIG. 12A).

Then, the lower mold MDa and the upper mold MDb are closed, so that the lead frame LF is clamped by the lower mold MDa and the upper mold MDb. At this step, the lead frame LF is sandwiched closely between the lower mold MDa and the upper mold MDb so as to prevent leakage of the resin REa, thereby to fix the lead frame LF. The semiconductor chip SC, a plurality of bonding wires BW, the die pad DP, portions of a plurality of leads LE, and a plurality of suspended leads HL are arranged in one package region formed by the cavities CVa and CVb.

Then, the temperature is raised, thereby to force feed and pour the liquefied resin REa through the gate GA into the cavities CVa and CVb. As a result, the insides of the cavities CVa and CVb are filled with the resin REa. The filling pressure is, for example, about 15 MPa.

As shown in FIG. 9, the resin REa flows through the gate GA into the cavities CVa and CVb, and flows on the upper surface side and on the side surface side of the semiconductor chip SC, to flow in the direction of the vent VE facing to the gate GA across the center of the semiconductor chip SC. As a result, the semiconductor chip SC, a plurality of bonding wires BW, the die pad DP, portions of a plurality of leads LE, and a plurality of suspended leads HL are sealed by the resin REa, resulting in the formation of a sealing body RE. The sealing body RE is formed of an epoxy type thermosetting insulation resin including, for example, a phenol type curing agent, silicone rubber, and a large number of fillers (e.g., silica) added therein for the purpose of reducing the stress.

Thereafter, the lead frame LF including a plurality of sealing bodies RE formed therein is taken out from the transfer molding device.

Then, the lead frame LF including a plurality of sealing bodies RE formed therein is subjected to an annealing treatment (baking treatment or after-cure). The annealing treatment is performed at a temperature of, for example, a temperature of about 160° C. to 190° C. for about 7 hours. This heat treatment causes further curing promotion of the sealing body RE, thereby to improve the adhesion to the lead frame LF, and the like.

6. Plating Step

Then, the lead frame LF is subjected to a plating treatment. As a result, a plated film formed of, for example, tin (Sn), tin-silver (Sn—Ag) type alloy, tin-copper (Sr—Cu) type alloy, tin-bismuth (Sn—Bi) type alloy, or tin-lead (Sn—Pb) type alloy with a thickness of 10 µm or less is formed on the first surface and the second surface not resin-sealed of the lead frame LF.

7. Lead Cutting Step

Then, as shown in FIGS. 10A and 10B, using a cutting device, the tie bars TB set between the plurality of leads LE are cut. Then, excess resin burrs are removed from the sealing body RE. Further, using a cutting device, the plurality of leads LE and the plurality of suspended leads HL are cut, so that the main body of the lead frame LF is cut into individual unit frames SF.

For cutting, for example, over a die (cradle) included in the cutting device, the lead frame LF is placed. First, the plurality of leads LE are cut. Then, the plurality of suspended leads HL are cut. The plurality of suspended leads HL suspend the tab DP and the sealing body RE. For this reason, at the stage of cutting the plurality of leads LE, the sealing body RE is not separated from the main body of the lead frame LF. At the stage of cutting the plurality of suspended leads HL, the sealing body RE is separated from the main body of the lead frame LF.

8. Lead Molding Step

Then, as shown in FIGS. 11A and 11B, the plurality of leads LE exposed from the sealing body RE are molded into a prescribed shape, for example, a gull wing shape by the molding mold. As a result, the semiconductor device SM is substantially completed.

In the foregoing description, manufacturing of the semiconductor device SM is performed in the order of the plating step, the lead cutting step, and the lead molding step. However, after the lead cutting step, the plating step and the lead molding step may be sequentially performed.

9. Inspection Step

Then, the semiconductor devices SM are sorted into good products and bad products through the test steps such as an electrical inspection and a visual inspection according to the product standards.

10. Shipping Step

Then, the semiconductor devices SM determined as good products are sorted in accordance with the product standards, and are further subjected to the final visual inspection, followed by shipping.

Configuration and Problems of Semiconductor Device in Accordance With Comparative Example Then, the configuration and problems of a semiconductor device in accordance with Comparative Example studied by the present inventors will be described by reference to FIGS. 12A and 12B to 17.

Figure 13A:
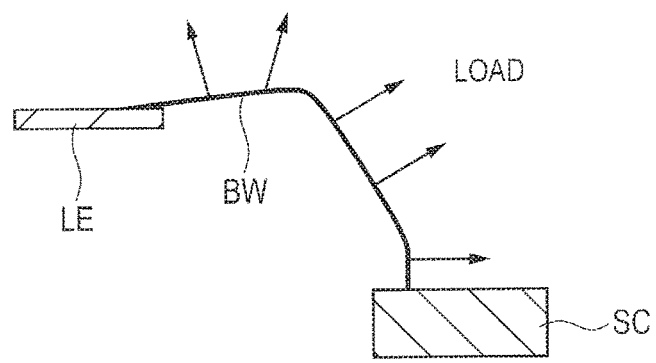
FIGS. 13A and 13B are each an explanatory view of a first problem, where
Figure 13B:
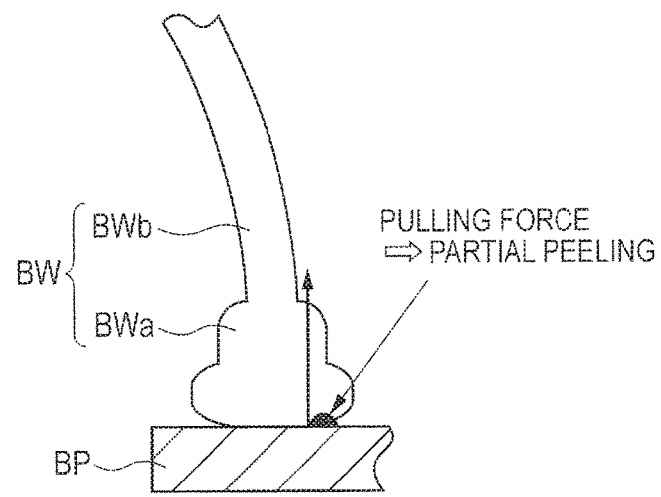
Figure 14A:
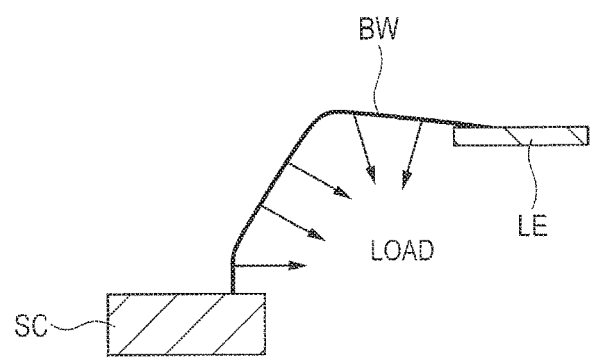
FIGS. 14A and 14B are each an illustrative view of a second problem, where
Figure 14B:
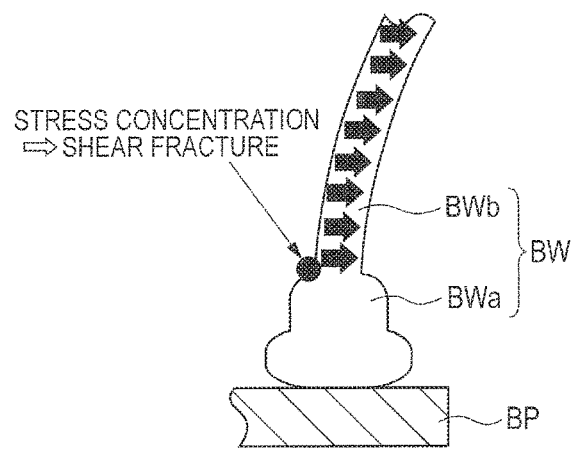
Figure 15:
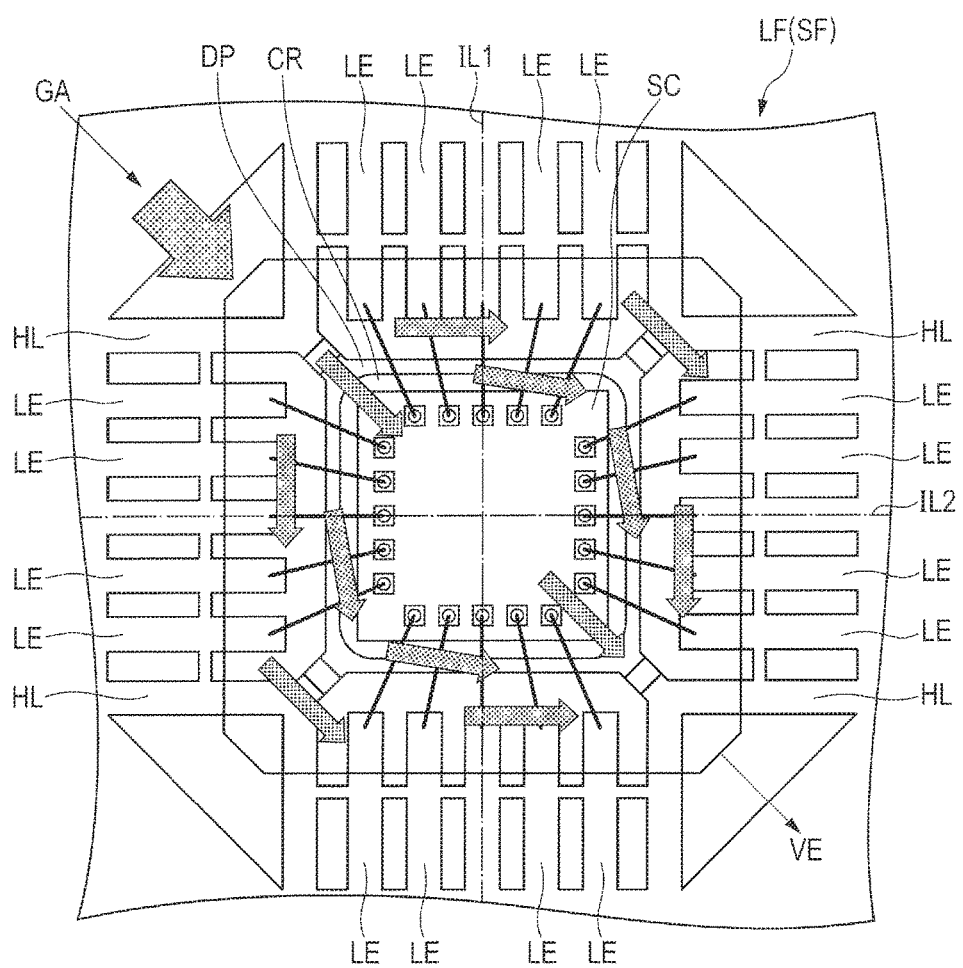
FIG. 15 is an illustrative view of a third problem, and a plan view for illustrating the flow of the resin from the gate into the vent in the molding step.
Figure 16:
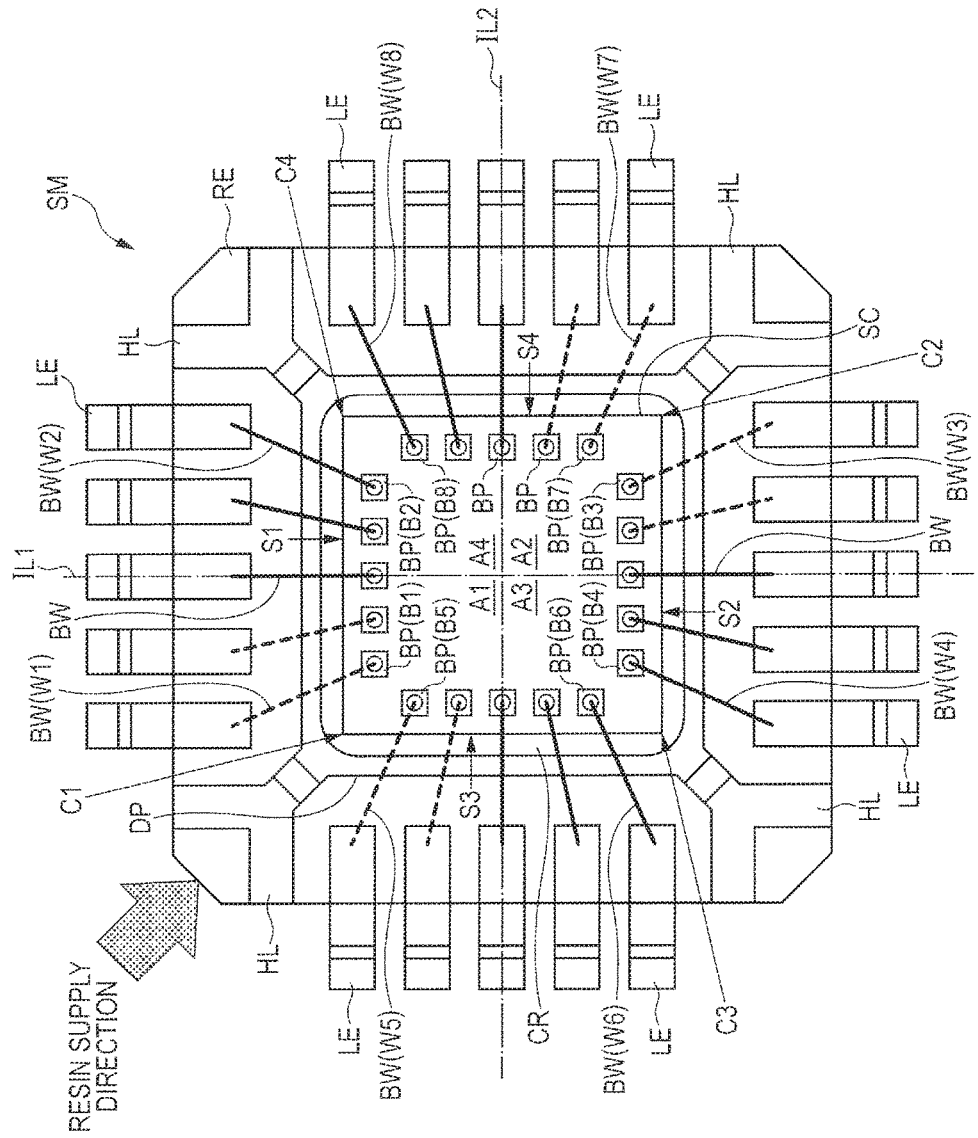
FIG. 16 is a plan view for illustrating one example of the bonding wire requiring the solutions to the first and second problems.
Figure 17:
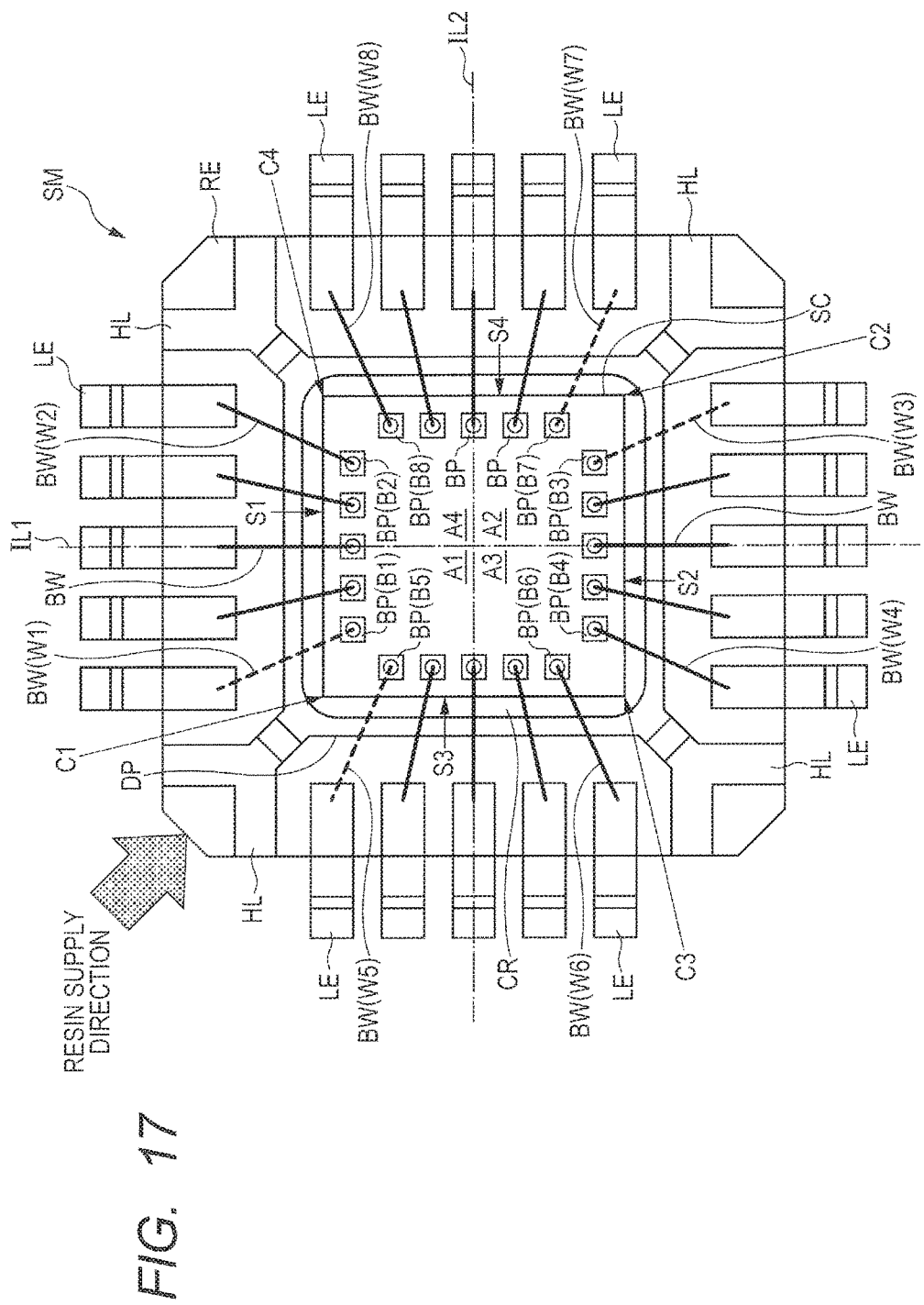
FIG. 17 is a plan view for illustrating another example of the bonding wire requiring the solutions to the first and second problems.

FIG. 12A is a cross sectional view for illustrating the flow of the resin from the gate into the vent in the molding step. FIG. 12B is a cross sectional view for illustrating the flow of the resin in the periphery of the bonding wires respectively situated in the vicinity of the gate and in the vicinity of the vent in the molding step. FIGS. 13A and 13B are each an explanatory view of a first problem, where FIG. 13A is a status view of the stress received by the bonding wire situated in the vicinity of the gate in the molding step, and FIG. 13B is a schematic view for illustrating the peeling of the ball part of the bonding wire. FIGS. 14A and 14B are each an explanatory view of a second problem, wherein FIG. 14A is a status view of the stress received by the bonding wire situated in the vicinity of the vent in the molding step, and FIG. 14B is a schematic view for illustrating cutting of the junction part (neck part) between the ball part and the core part of the bonding wire. FIG. 15 is an explanatory view of a third problem, and a plan view for illustrating the flow of the resin through the gate into the vent in the molding step. FIG. 16 is a plan view for illustrating one example of the bonding wire requiring the solution to the first and second problems. FIG. 17 is a plan view for illustrating another example of the bonding wire requiring the solution to the first and second problems.

Incidentally, three vents are provided in the molding mold included in the transfer molding device for use in the molding step. The term "vent" herein referred to means the vent facing to the gate across the center of the semiconductor chip SC, namely, the vent for finally exhausting the air or gas in the cavities CVa and CVb of the three vents. Further, in FIGS. 12A and 12B, and FIG. 15, each arrow indicated with shaded hatching shows the flow of the resin.

As shown in FIG. 12A, the gate GA serving as the inlet for allowing the resin to flow therethrough into the cavities CVa and CVb is formed in each of the lower mold MDa and the upper mold MDb. Therefore, the resin is poured from the upper side and from the lower side of the suspended lead HL into the cavities CVa and CVb. Further, the vent VE serving as the outlet for exhausting the air or gas in the cavities CVa and CVb therethrough is formed at a position facing to the gate GA across the center of the semiconductor chip SC in each of the lower mold MDa and the upper mold MDb.

Then, as described previously, the resin passes through the gate GA to the upper side, the lower side, and the side surface side of the suspended lead HL, to flow into the cavities CVa and CVb, and flows through the upper surface side and the side surface side of the semiconductor chip SC, to flow in the direction of the vent VE facing to the gate GA across the center of the semiconductor chip SC (see FIG. 15).

However, as shown in FIG. 12B, at the bonding wire BW situated in the vicinity of the gate GA, the resin flows from upstream to downstream through the upper side and the lower side of the bonding wire BW, respectively. The flow rate of the resin flowing through the lower side of the bonding wire BW is slower than the flow rate of the resin flowing through the upper side of the bonding wire BW.

The bonding wires BW situated in the vicinity of the gate GA are, for example, the first wire W1 and the fifth wire W5 to be connected with the first electrode pad B1 and the fifth electrode pad B5, respectively, situated closest to the first corner part C1 of the semiconductor chip SC shown in FIG. 1. Further, the bonding wires BW situated in the vicinity of the gate GA may include, in addition to the first wire W1 and the fifth wire W5, for example, a plurality of bonding wires BW to be connected with the electrode pad BP situated adjacent to the first electrode pad B1 along the first side S1 and the electrode pad BP situated adjacent to the fifth electrode pad B5 along the third side S3, respectively, shown in FIG. 1. Further, the bonding wires BW situated in the vicinity of the gate GA may include, in addition to the first wire W1 and the fifth wire W5, for example, a plurality of bonding wires BW to be respectively connected with a plurality of electrode pads BP situated in the first region A1 shown in FIG. 1.

Further, as shown in FIG. 12B, for the bonding wire BW situated in the vicinity of the vent VE, the upper side of the bonding wire BW serves as upstream, and the lower side thereof serves as downstream. Accordingly, the resin flows from the upper side toward the lower side of the bonding wire BW.

The bonding wires BW situated in the vicinity of the vent VE are, for example, the third wire W3 and the seventh wire W7 to be connected with the third electrode pad B3 and the seventh electrode pad B7, respectively, situated closest to the second corner part C2 of the semiconductor chip SC shown in FIG. 1. Further, the bonding wires BW situated in the vicinity of the vent VA may include, in addition to the third wire W3 and the seventh wire W7, for example, a plurality of bonding wires BW to be connected with the electrode pad BP situated adjacent to the third electrode pad B3 along the second side S2 and the electrode pad BP situated adjacent to the seventh electrode pad B7 along the fourth side S4, respectively, shown in FIG. 1. Further, the bonding wires BW situated in the vicinity of the vent VA may include, in addition to the third wire W3 and the seventh wire W7, for example, a plurality of bonding wires BW to be respectively connected with a plurality of electrode pads BP situated in the second region A2 shown in FIG. 1.

For this reason, as shown in FIG. 13A, in the molding step, the bonding wires BV situated in the vicinity of the gate GA is applied with a load in the direction from the lower side thereof toward the upper side thereof.

When the bonding wires BW situated in the vicinity of the gate GA is applied with the upward load, as shown in FIG. 13B, for example, in a reliability test, particularly, a temperature cycle test, the thermal expansion or the expansion or shrinkage of the resin results in an increase in tensile force at the junction part between the ball part BWa of the bonding wire BW and the electrode pad BP. Thus, peeling of the bonding wire BW from the electrode pad BP becomes more likely to be caused (first problem).

Further, as shown in FIG. 14B, in the molding step, the bonding wire BW situated in the vicinity of the vent VE is applied with a load in the direction from the upper side thereof toward the lower side thereof.

When the bonding wire BW situated in the vicinity of the vent VE is applied with a downward load, as shown in FIG. 14B, for example, in a reliability test, particularly, a temperature cycle test, a stress is concentrated to the junction part (neck part) between the ball part BWa and the core part BWb of the bonding wire BW. Thus, cutting (shear fracture or cracking) of the junction part (neck part) becomes more likely to be caused (second problem).

Further, in the molding step, the bonding wires BP having a loop shape in the direction along the flow of the resin are small in number. For this reason, a plurality of bonding wires BW have a problem of wire sweep (third problem).

The study conducted by the present inventors revealed that, as shown in FIG. 15, wire sweep tends to be caused in other bonding wires BW than the bonding wires BW situated in the vicinity of the gate GA and in the vicinity of the vent VE, respectively.

However, other bonding wires BW than the bonding wires BW situated in the vicinity of the gate GA and in the vicinity of the vent VP, respectively, are less likely to be applied with an upward load (see FIG. 13A) than the bonding wires BW situated in the vicinity of the gate GA and in the vicinity of the vent VP, respectively, in the molding step, and hence peeling of the bonding wire BW is less likely to be caused.

Further, other bonding wires BW than the bonding wires BW situated in the vicinity of the gate GA and in the vicinity of the vent VE, respectively, are less likely to be applied with a downward load (see FIG. 14A) than the bonding wires BW situated in the vicinity of the gate GA and in the vicinity of the vent VE, respectively, in the molding step, and hence cutting of the bonding wire BW is less likely to be caused.

Currently, the wire diameter of the bonding wire BW is, for example, 15 µm to 20 µm. However, with the trend toward smaller size and higher density of a semiconductor device, the interval between mutually adjacent electrode pads BP has been rapidly decreasing. Accordingly, the wire diameter of the bonding wire BW further decreases. The demand for the bonding wire BW with a wire diameter of 10 µm or smaller is also expected.

Thus, when the wire diameter of the bonding wire BW becomes 10 µm or less, peeling of the bonding wire BW (first problem), cutting of the bonding wire BW (second problem), and wire sweep of the bonding wire BW (third problem) become further more serious. For example, in the reliability test, particularly, a temperature cycle test, peeling of the bonding wire BW (first problem) and cutting of the bonding wire BW (second problem) may be unavoidable.

FIG. 16 shows the bonding wires BW which tend to undergo peeling (first problem) or cutting (second problem)

The bonding wires BW requiring the solution to the problem of peeling are a plurality of bonding wires BW to be connected with the first electrode pad B1 and the fifth electrode pad B5 situated closest to the first corner part C1 of the semiconductor chip SC, and the electrode pad BP situated adjacent to the first electrode pad B1 along the first side S1, and the electrode pad BP situated adjacent to the fifth electrode pad B5 along the third side S3, respectively. Further, the bonding wires BW requiring the solution to the problem of peeling may include a plurality of bonding wires BW to be respectively connected with a plurality of electrode pads BP situated in the first region A1 including the first corner part C1 of the semiconductor chip SC when the main surface of the semiconductor chip SC is divided by the first virtual line IL1 and the second virtual line IL2 in plan view.

Further, the bonding wires BW requiring the solution to the problem of cutting are a plurality of bonding wires BW to be connected with the third electrode pad B3 and the seventh electrode pad B7 situated closest to the second corner part C2 of the semiconductor chip SC, and the electrode pad BP situated adjacent to the third electrode pad B3 along the second side S2, and the electrode pad BP situated adjacent to the seventh electrode pad B7 along the fourth side S4, respectively. Further, the bonding wires BW requiring the solution to the problem of cutting may include a plurality of bonding wires BW to be respectively connected with a plurality of electrode pads BP situated in the second region A2 including the second corner part C2 of the semiconductor chip SC when the main surface of the semiconductor chip SC is divided by the first virtual line IL1 and the second virtual line IL2 in plan view.

FIG. 17 shows the bonding wires BW which are most likely to undergo peeling (first problem) and cutting (second problem).

The bonding wires BW requiring the solution to the problem of peeling are a plurality of bonding wires BW to be connected with the first electrode pad B1 and the fifth electrode pad B5 situated closest to the first corner part C1 of the semiconductor chip SC, respectively.

Further, the bonding wires BW requiring the solution to the problem of cutting are a plurality of bonding wires BW to be connected with the third electrode pad B3 and the seventh electrode pad B7 situated closest to the second corner part C2 of the semiconductor chip SC, respectively.

Features and Effects of Semiconductor Device in Accordance With the Present Embodiment In the semiconductor device in accordance with the present embodiment, for example, as shown in FIG. 1, the bonding wires BW situated in the vicinity of the gate GA and in the vicinity of the vent VE, respectively in the molding step are make a large detour toward the inside of the semiconductor chip SC, and have a loop shape falling in the inward direction of the semiconductor chip SC (which may be hereinafter referred to as inwardly falling loop shape). Namely, the bonding wires BW situated in the vicinity of the gate GA and in the vicinity of the vent VE, respectively, in the molding step have a weak pulling force (tension), and are loosely stretched with a margin.

In contrast, other bonding wires BW than the bonding wires BW situated in the vicinity of the gate GA and in the vicinity of the vent VE, in the molding step do not make a detour toward the inside direction of the semiconductor chip SC, and have a loop shape not falling in the inward direction of the semiconductor chip SC. Namely, other bonding wires BW than the bonding wires BW situated in the vicinity of the gate GA and in the vicinity of the vent VE, respectively, in the molding step have a strong pulling force (tension), and are tightly stretched.

Herein, the bonding wires BW situated in the vicinity of the gate GA in the molding step are the first wire W1 and the fifth wire W5 to be connected with the first electrode pad B1 and the fifth electrode pad B5 situated closest to the first corner part C1 of the semi conductor chip SC, respectively. Alternatively, the bonding wires BW situated in the vicinity of the gate GA in the molding step are, in addition to the first wire W1 and the fifth wire W5, the bonding wire BW to be connected with the electrode pad BP situated adjacent to the first electrode pad B1 along the first side S1, and the bonding wire BW to be connected with the electrode pad BP situated adjacent to the fifth electrode pad B5 along the third side S3. Still alternatively, the bonding wires BW situated in the vicinity of the gate GA in the molding step are a plurality of bonding wires BW to be respectively connected with a plurality of electrode pads BP situated in the first region A1 including the first corner part C1 of the semiconductor chip SC when the main surface of the semiconductor chip SC is divided by the first virtual line IL1 and the second virtual line IL2.

Further, the bonding wires BW situated in the vicinity of the vent VE in the molding step are the third wire W3 and the seventh wire W7 to be connected with the third electrode pad B3 and the seventh electrode pad B7, respectively, situated closest to the second corner part C2 of the semi-conductor chip SC. Alternatively, the bonding wires BW situated in the vicinity of the vent VE in the molding step are, in addition to the third wire W3 and the seventh wire W7, the bonding wire BW to be connected with the electrode pad BP situated adjacent to the third electrode pad B3 along the second side S2, and the bonding wire BW to be connected with the electrode pad BP situated adjacent to the seventh electrode pad B7 along the fourth side S4. Still alternatively, the bonding wires BW situated in the vicinity of the gate GA in the molding step are a plurality of bonding wires BW to be respectively connected with a plurality of electrode pads BP situated in the second region A2 including the second corner part C2 of the semiconductor chip SC when the main surface of the semiconductor chip SC is divided by the first virtual line IL1 and the second virtual line IL2.

As described previously, in the molding step of one of the manufacturing steps of the semiconductor device, the bonding wires BW situated in the vicinity of the gate GA are applied with a load in the direction from the lower side thereof toward the upper side thereof (see FIG. 13A). For this reason, for example, by the thermal expansion or shrinkage of the resin in a reliability test, particularly, a temperature cycle test, the upward load causes an increase in tensile force at the junction part between the ball part BWa of the bonding wire BW and the electrode pad BP situated in the vicinity of the gate GA in the molding step. As a result, the bonding wires BW each become more likely to be peeled from the electrode pad BP (first problem).

However, in the present embodiment, the bonding wires BW situated in the vicinity of the gate GA in the molding step are each formed in an inwardly falling loop shape. Namely, the bonding wires BW situated in the vicinity of the gate GA in the molding step have a weak pulling force (tension), and are loosely stretched with a margin. Therefore, even when in the molding step, the bonding wires BW situated in the vicinity of the gate GA are applied with an upward load, the pulling force at the junction part between the ball part BWa of the bonding wire BW and the electrode pad BP situated in the vicinity of the gate GA caused in, for example, a reliability test, particularly, a temperature cycle test is small. For this reason, the bonding wires BW each become less likely to be peeled from the electrode pad BP (solution to the first problem).

Further, as described previously, in the molding step of one of the manufacturing steps of the semiconductor device, the bonding wires BW situated in the vicinity of the vent VE are applied with a load in the direction from the upper side thereof toward the lower side thereof (see FIG. 14A). For this reason, for example, by the thermal expansion or shrinkage of the resin in a reliability test, particularly, a temperature cycle test, due to the downward load, the junction part (neck part) between the ball part BWa and the core part BWb of each bonding wire BW situated in the vicinity of the vent VE in the molding step becomes more likely to be cut (second problem).

However, in the present embodiment, the bonding wires BW situated in the vicinity of the vent VE in the molding step are formed in an inwardly falling loop. Namely, the bonding wires BW situated in the vicinity of the vent VE in the molding step have a weak pulling force (tension), and are loosely stretched with a margin. Therefore, even when in the molding step, the bonding wires BW situated in the vicinity of the vent VE are applied with a downward load, the stress caused in, for example, a reliability test, particularly, a temperature cycle test is not concentrated to the junction part (neck part) between the ball part BWa and the core part BWb of each bonding wire BW situated in the vicinity of the vent VE. For this reason, the bonding wires BW each become less likely to be cut (solution to the second problem).

Further, as described previously, in the molding step of one of the manufacturing steps of the semiconductor device, there is a problem of wire sweep caused by the flow of the resin. The bonding wires BW which tend to undergo wire sweep are other bonding wires BW than the bonding wires BW situated in the vicinity of the gate GA and in the vicinity of the vent VE, respectively, in the molding step. Alternatively, the bonding wires BW which tend to undergo wire sweep are a plurality of bonding wires BW to be respectively connected with a plurality of electrode pads BP situated in the third region A3 including the third corner part C2 of the semiconductor chip SC, and the fourth region A4 including the fourth corner part C4 of the semiconductor chip SC, respectively, when the main surface of the semiconductor chip SC is divided by the first virtual line IL1 and the second virtual line IL2 (third problem).

However, in the present embodiment, other bonding wires BW than the bonding wires BW situated in the vicinity of the gate GA and in the vicinity of the vent VE, respectively, in the molding step have a strong pulling force (tension), and are tightly stretched. Alternatively, a plurality of bonding wires BW to be respectively connected with a plurality of electrode pads BP situated in the third region A3 including the third corner part C2 of the semiconductor chip SC, and the fourth region A4 including the fourth corner part C4 of the semiconductor chip SC, respectively, have a strong pulling force (tension), and are tightly stretched. As a result, it is possible to circumvent the problem of wire sweep of the bonding wire BW caused by the flow of the resin (solution to the third problem).

Thus, in accordance with the present embodiment, it is possible to circumvent the peeling of the bonding wire BW (first problem), cutting of the bonding wire BW (second problem), and the wire sweep of the bonding wire BW (third problem). As a result, even when the wire diameter of the bonding wire is thinned as a means for implementing the size reduction and the cost reduction of the semiconductor device, it is possible to implement a semiconductor device with a high reliability.

Incidentally, in the present embodiment, in the molding step of one of the manufacturing steps of the semiconductor device, the molding mold was used in which the gate GA serving as the inlet for pouring the resin into the cavities CVa and CVb therethrough is formed in the lower mold MDa and the upper mold MDb (see FIG. 12A). Namely, through the upper gate situated on the upper surface side of the lead frame LF, and the lower gate situated on the lower surface side of the lead frame LF, the resin is poured into the cavities CVa and CVb, respectively. However, the present embodiment is not limited thereto, and is also applicable to the molding step using a molding mold in which the gate GA serving as the inlet for pouring the resin into the cavities CVa and CVb therethrough is formed only in the lower mold MDa. Namely, also when the resin is poured from only the lower gate situated on the lower surface side of the lead frame LF into the cavities CVa and CVb, the bonding wires BW situated in the vicinity of the gate GA are applied with a load in the direction from the lower side thereof toward the upper side thereof. Accordingly, the ball part BWa becomes more likely to be peeled from the electrode pad BP (first problem). Therefore, also when the semiconductor device is manufactured in the molding step using a molding mold including only a lower gate, it is effective to apply the loop shape of the bonding wire BW in accordance with the present embodiment.

MODIFIED EXAMPLE

Up to this point, the invention completed by the present inventors was specifically described by way of embodiments. However, it is naturally understood that the present invention is not limited to the embodiments, and may be variously changed within the scope not departing from the gist thereof.

Modified Example 1

A semiconductor device in accordance with Modified Example 1 of the present embodiment will be described by reference to FIG. 18.

Figure 18:
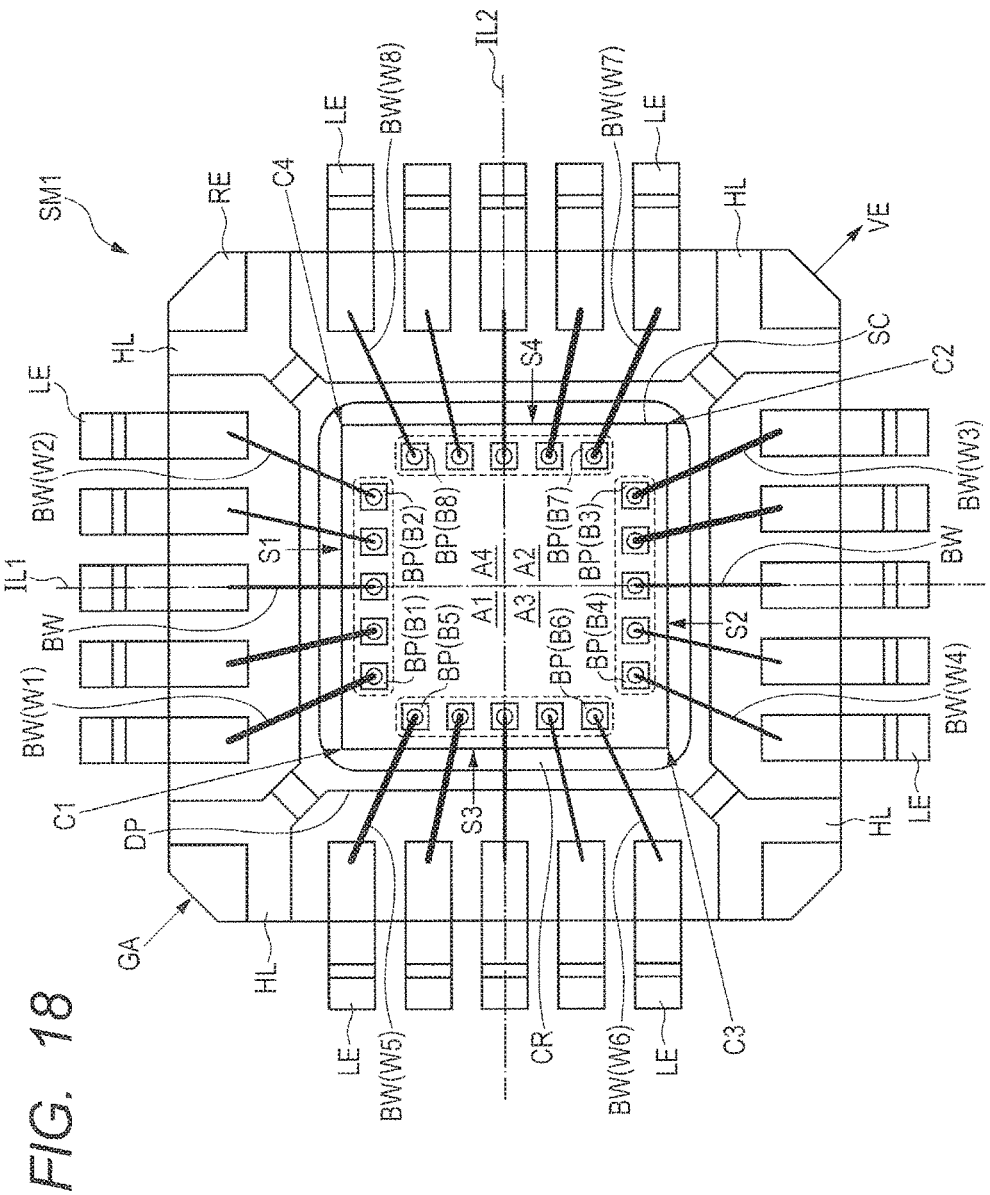
FIG. 18 is a top view of a semiconductor device embodiment in accordance with Modified Example 1 of the embodiment.

FIG. 18 is a top view of the semiconductor device in accordance with Modified Example 1 of the present embodiment.

Incidentally, the differences between the semiconductor device SM1 in accordance with Modified Example 1 and the semiconductor device SM in accordance with the embodiment reside in the wire diameter and the loop shape of the bonding wire. Other configurations are nearly equal therebetween. Below, the differences will be mainly described.

As shown in FIG. 18, in the semiconductor device SM1 in accordance with Modified Example 1, none of the bonding wires BW make a detour toward the inside of the semiconductor chip SC, and all the bonding wires BW have a strong pulling force (tension), and are tightly stretched.

However, in the semiconductor device SM1 in accordance with Modified Example 1, of a plurality of bonding wires, the bonding wires BW situated in the vicinity of the gate GA and in the vicinity of the vent VE, respectively, in the molding step each have a larger wire diameter than the wire diameter of each bonding wire BW in other parts, and each have, for example, a larger diameter than 20 µm.

Herein, the bonding wires BW situated in the vicinity of the gate GA in the molding step are the first wire W1 and the fifth wire W5 to be connected with the first electrode pad B1 and the fifth electrode pad B5, respectively, situated closest to the first corner part C1 of The semiconductor chip SC. Alternatively, the bonding wires BW situated in the vicinity of the gate GA in the molding step are, in addition to the first wire W1 and the fifth wire W5, the bonding wire BW to be connected with the electrode pad BP situated adjacent to the first electrode pad B1 along the first side S1 and the bonding wire BW to be connected with the electrode pad BP situated adjacent to the fifth electrode pad B5 along the third side S3. Still alternatively, the bonding wires BW situated in the vicinity of the gate GA in the molding step are a plurality of bonding wires BW to be respectively connected with a plurality of electrode pads BP situated in the first region A1 including the first corner part C1 of the semiconductor chip SC when the main surface of the semiconductor chip SC is divided by the first virtual line IL1 and the second virtual line IL2.

Further, the bonding wires BW situated in the vicinity of the vent VE in the molding step are the third wire W3 and the seventh wire W7 to be connected with the third electrode pad B3 and the seventh electrode pad B7 situated closest to the second corner part C2 of the semiconductor chip SC. Alternatively, the bonding wires BW situated in the vicinity of the vent VE in the molding step are, in addition to the third wire W3 and the seventh wire W7, the bonding wire BW to be connected with the electrode pad BP situated adjacent to the third electrode pad B3 along the second side S2 and the bonding wire BW to be connected with the electrode pad BP situated adjacent to the seventh electrode pad B7 along the fourth side S4. Still alternatively, the bonding wires BW situated in the vicinity of the vent VE the molding step are a plurality of bonding wires BW to be respectively connected with a plurality of electrode pads BP situated in the second region A2 including the second corner part C2 of the semiconductor chip SC when the main surface of the semiconductor chip SC is divided by the first virtual line IL1 and the second virtual line IL2.

Thus, in accordance with Modified Example 1, by increasing the wire diameter of each bonding wire BW situated in the vicinity of the gate GA in the molding step, the upward load applied to each bonding wire BW situated in the vicinity of the gate GA is reduced in the molding step. Therefore, for example, even when thermal expansion or shrinkage of the resin is caused in a reliability test, particularly, a temperature cycle test, the tensile force at the junction part between the ball part BWa of the bonding wire BW and the electrode pad BP situated in the vicinity of the gate GA in the molding step is small. For this reason, the bonding wire WB becomes less likely to be peeled from the electrode pad BP (solution to the first problem).

Further, in accordance with Modified Example 1, by increasing the wire diameter of each bonding wire BW situated in the vicinity of the vent VE in the molding step, the downward load applied to each bonding wire BW situated in the vicinity of the vent VE is reduced in the molding step. Therefore, for example, even when thermal expansion or shrinkage of the resin is caused in a reliability test, particularly, a temperature cycle test, a stress is not concentrated to the junction part (neck part) between the ball part BWa and the core part BWb of the bonding wire BW situated in the vicinity of the vent VE in the molding step. For this reason, the bonding wire BW becomes less likely to be cut (solution to the second problem).

Further, in accordance with Modified Example 1, all of the bonding wires BW have a strong pulling force (tension), and are tightly stretched. This can circumvent the problem of wire sweep caused by the flow of the resin (solution to the third problem).

Modified Example 2

A semiconductor device in accordance with Modified Example 2 of the present embodiment will be described by reference to FIG. 19.

Figure 19:
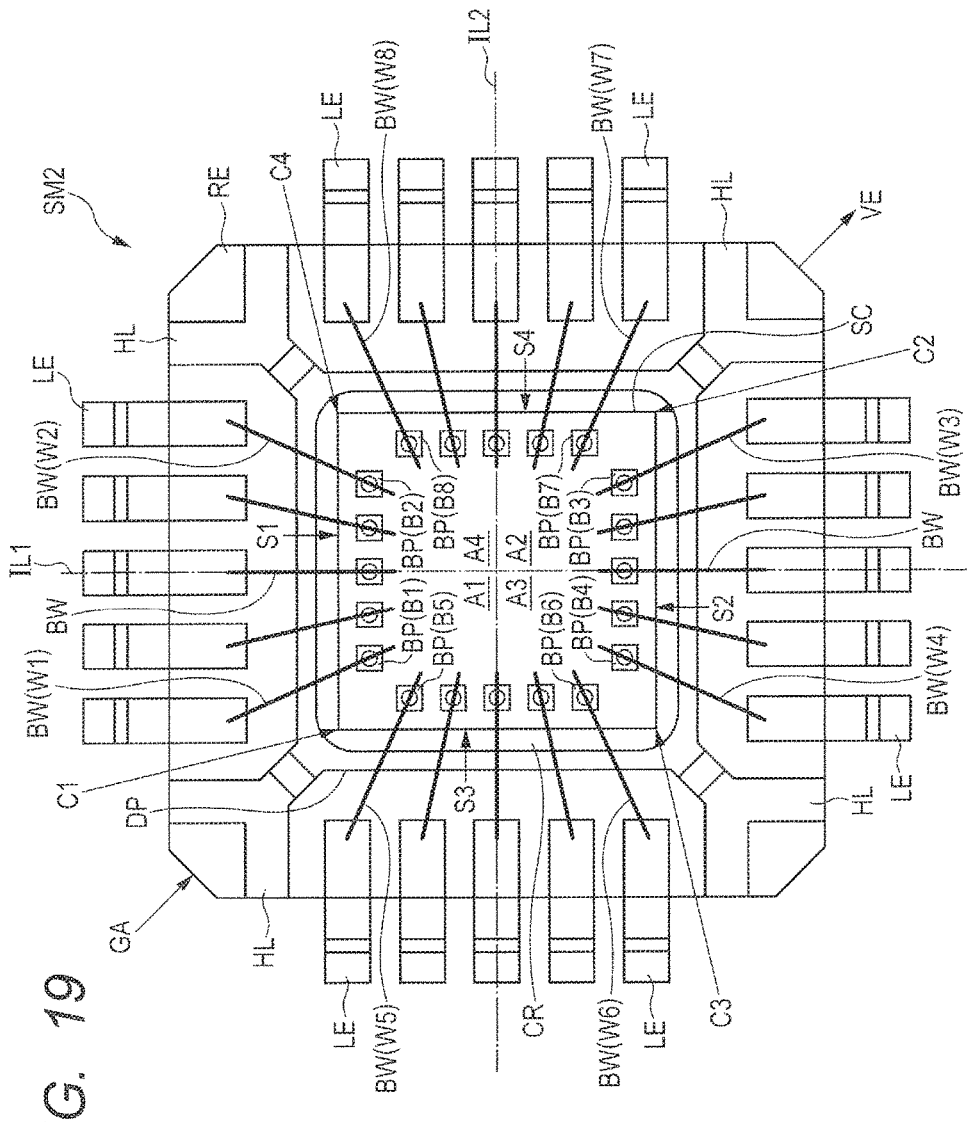
FIG. 19 is a top view of a semiconductor device in accordance with Modified Example 2 of the embodiment.

FIG. 19 is a top view of the semiconductor device in accordance with Modified Example 2 of the present embodiment.

Incidentally, the difference between the semiconductor device SM2 accordance with Modified Example 2 and the semiconductor device SM in accordance with the embodiment resides in the loop shape of the bonding wire. Other configurations are almost equal therebetween. Below, the difference will be mainly described.

As shown in FIG. 19, in the semiconductor device SM2 in accordance with Modified Example 2, all The bonding wires BW make a detour toward the inside of the semiconductor chip SC, have a weak pulling force (tension), and are loosely stretched with a margin.

In the molding step of one of the manufacturing steps of the semiconductor device SM2, when the filling pressure of the resin in the embodiment is low, all the bonding wires BW have a weak pulling force (tension), and can also be loosely stretched with a margin.

As a result, for example, even when thermal expansion or shrinkage of the resin is caused in a reliability test, particularly, a temperature cycle test, the tensile force at the junction part between the ball part BWa of the bonding wire BW and the electrode pad BP situated in the vicinity of the gate GA in the molding step is small. For this reason, the bonding wires BW each become less likely to be peeled from the electrode pad BP (solution to the first problem).

Further, for example, even when thermal expansion or shrinkage of the resin is caused in a reliability test, particularly, a temperature cycle test, a stress is not concentrated to the junction part (neck part) between the ball part BWa and the core part BWb of the bonding wire BW situated in the vicinity of the vent VE in the molding step. For this reason, the bonding wire BW becomes less likely to be cut (solution to the second problem).

Whereas, when the filling pressure of the resin is low, even if the length of the bonding wire BW is long, it becomes possible to circumvent the problem of wire sweep caused by the flow of the resin (solution to the third problem).

However, in the molding step, the time until the completion of filling of the resin into the cavities becomes longer. Accordingly, the resin poured at the initial stage may be solidified.

Modified Example 3

A semiconductor device in accordance with Modified Example 3 of the present embodiment will be described by reference to FIG. 20.

Figure 20:
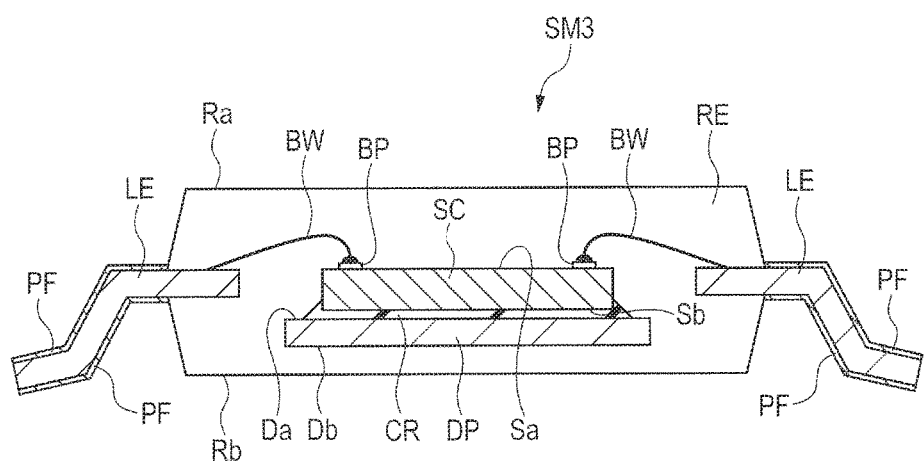
FIG. 20 is a cross sectional view of a semiconductor device in accordance with Modified Example 3 of the embodiment.

FIG. 20 is a cross sectional view of the semiconductor device in accordance with Modified Example 3 of the present embodiment.

The semiconductor device SM in accordance with the embodiment is a so-called tab-exposed type semiconductor device in which the lower surface of the die pad DP is exposed from, the bottom surface of the sealing body RE. However, the semiconductor device SM3 in accordance with Modified Example 3 is a so-called tab-integrated type semiconductor device in which the lower surface of the die pad is not exposed from the bottom surface of the sealing body RE.

Incidentally, other configurations are almost equal therebetween. Namely, a plurality of bonding wires BW situated in the vicinity of the gate GA and in the vicinity of the vent VE, respectively, in the molding step make a detour toward the inside of the semiconductor chip SC as with the embodiment, have a weak pulling force (tension), and are loosely stretched with a margin. Below, the difference will be mainly described.

In the tab-integrated type semiconductor device SM3, as compared with the tab-exposed type semiconductor device SM, in the molding step of one of the manufacturing steps of the semiconductor device SM3, the bonding wires BW situated in the vicinity of the gate become less likely to be applied with a load in a direction from the lower side thereof toward the upper side thereof. Therefore, in the tab-integrated type semiconductor device SM3, as compared with the tab-exposed type semiconductor device SM, even when thermal expansion or shrinkage of the resin is caused in, for example, a reliability test, particularly, a temperature cycle test, the bonding wires BW situated in the vicinity of the gate in the molding step are less likely to be peeled from their respective electrode pads BP.

Further, in the tab-integrated type semiconductor device SM3, as compared with the tab-exposed type semiconductor device SM, in the molding step of one of the manufacturing steps of the semiconductor device SM3, the bonding wires BW situated in the vicinity of the vent become less likely to be applied with a load in a direction from the upper side thereof toward the lower side thereof. Therefore, in the tab-integrated type semiconductor device SM3, as compared with the tab-exposed type semiconductor device SM, even when thermal expansion or shrinkage of the resin is caused in, for example, a reliability test, particularly, a temperature cycle test, a stress is not concentrated to the junction part (neck part) between the ball part and the core part of each bonding wire BW situated in the vicinity of the vent in the molding step. For this reason, the bonding wire BW is less likely to be cut.

Thus, in the tab-integrated type semiconductor device SM3, as compared with the tab-exposed type semiconductor device SM, peeling of the bonding wire BW (first problem) and cutting of the bonding wire BW (second problem) are less likely to be caused. However, a plurality of bonding wires BW situated in the vicinity of the gate and in the vicinity of the vent, respectively, in the molding step are loosely stretched with a margin. As a result, peeling of the bonding wire BW (first problem) and cutting of the bonding wire BW (second problem) become still less likely to be caused.

However, when the plurality of bonding wires BW situated in the vicinity of the gate and in the vicinity of the vent, respectively, in the molding step uselessly become longer, wire sweep may be caused. Under such circumstances, in the tab-integrated type semiconductor device SM3, for example, the first wire W1 and the fifth wire W5 to be connected with the first electrode pad B1 and the fifth electrode pad B5 situated closest to the first corner part C1 of the semiconductor chip SC, respectively, are desirably loosely stretched with a margin (see FIG. 1). Further, in the tab-integrated type semiconductor device SM3, for example, the third wire W3 and the seventh wire W7 to be connected with the third electrode pad B3 and the seventh electrode pad B7 situated closest to the second corner part C2 of the semiconductor chip SC, respectively, are desirable loosely stretched with a margin (see FIG. 1). Namely, only the first wire W1, the fifth wire W5, the third wire W3, and the seventh wire W7 are loosely stretched with a margin. This can prevent wire sweep of other bonding wires BW.

Modified Example 4

A semiconductor device in accordance with Modified Example 4 of the present embodiment will be described by reference to FIG. 21.

Figure 21:
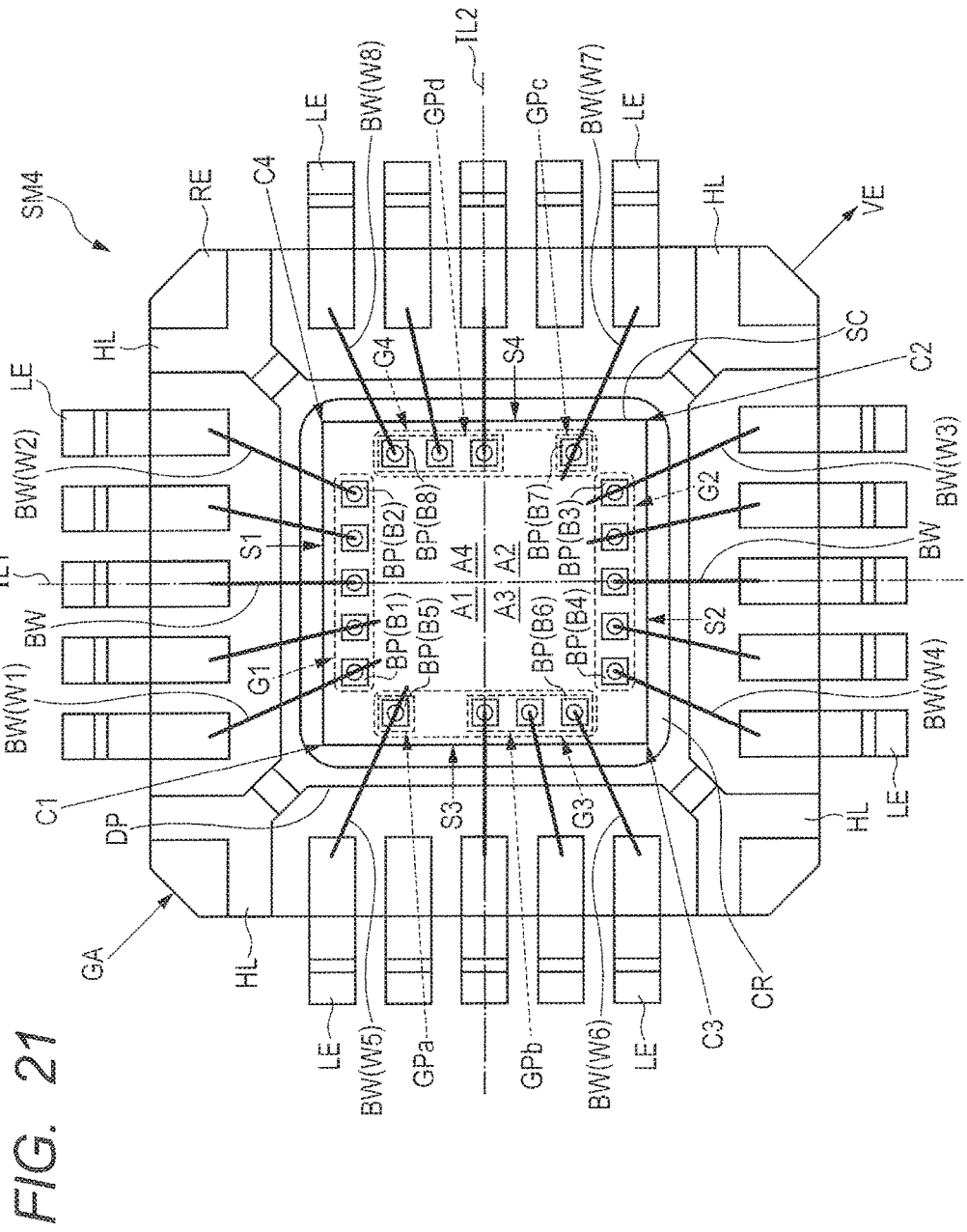
FIG. 21 is a top view of a semiconductor device in accordance with Modified Example 4 of the embodiment.

FIG. 21 is a top view of the semiconductor device in accordance with Modified Example 4 of the present embodiment.

Incidentally, the difference between the semiconductor device SM4 in accordance with Modified Example 4 and the semiconductor device SM in accordance with the embodiment resides in the arrangement of the electrode pads formed on the main surface of the semiconductor chip. Other configurations are almost equal therebetween. Below, the difference will be mainly described.

As shown in FIG. 21, a plurality of electrode pads BP included in the first pad group G1 are arranged at the same pitch as that of the plural ty of electrode pads BP described in the foregoing embodiment, for example, a first pitch. Then, the plurality of bonding wires BW to be connected with the first electrode ad B1 situated closest to the first corner part C1 of the semiconductor chip SC and the electrode pad BP situated adjacent to the first electrode pad B1 along the first side S1, respectively, have an inwardly falling loop shape.

Whereas, a plurality of electrode pads BP included in the second pad group G2 are arranged at the same pitch as the pitch of the plurality of electrode pads BP included in the first pad group G1, for example, the first pitch. Then, the plurality of bonding wires BW to be connected with the third electrode pad B3 situated closest to the second corner part C2 of the semiconductor chip SC and the electrode pad BP situated adjacent to the third electrode pad B3 along the second side S2, respectively, have an inwardly falling loop shape.

Further, a plurality of electrode pads BP included in the third pad group G3 include a first sub pad group GPa formed of a plurality of electrode pads BP including the fifth electrode pad B5 situated closest to the first corner part C1 of the semiconductor chip SC, and a second sub pad group GPb formed of a plurality of electrode pads BP including the sixth electrode pad B6 situated closest to the third corner part C3 of the semiconductor chip SC.

The plurality of electrode pads BP forming the first sub pad group GPa and the plurality of electrode pads BP forming the second sub pad group GPb are arranged at the first pitch, respectively. On the other hand, the electrode pad BP situated closest to the second sub pad group GPb of the plurality of electrode pads BP included in the first sub pad group GPa, and the electrode pad BP situated closest to the first sub pad group GPa of the plurality of electrode pads BP included in the second sub pad group GPb are arranged at a larger pitch than the first pitch. Namely, in the foregoing embodiment, the plurality of electrode pads BP included in the third pad group G3 are arranged at the same pitch. In contrast, in Modified Example 4, as shown in FIG. 21, there is a portion in which the electrode pads BP are arranged at a larger pitch than the first pitch. In other words, the third pad group G3 has a part in which the plurality of electrode pads BP are not arranged at an equal pitch. Then, the bonding wires BW to be respectively connected with the plurality of electrode pads BP forming the first sub pad group GPa each have an inwardly falling loop shape.

Incidentally, FIG. 21 shows one electrode pad BP as the plurality of electrode pads BP forming the first sub pad group GPa for ease of understanding. The first sub pad group GPa is formed of a plurality of electrode pads BP. However, the first sub pad group GPa formed of one electrode pad BP is not excluded.

Further, a plurality of electrode pads BP included in the fourth pad group G4 have a third sub pad group GPc formed of a plurality of electrode pads BP including the seventh electrode pad B7 situated closest to the second corner part C2 of the semiconductor chip SC, and a fourth sub pad group GPd formed of a plurality of electrode pads BP including the eighth electrode pad B8 situated closest to the fourth corner part C4 of the semiconductor chip SC.

The plurality of electrode pads BP forming the third sub pad group GPc and the plurality of electrode pads BP forming the fourth sub pad group GPd are arranged at the first pitch, respectively. On the other hand, the electrode pad BP situated closest to the fourth sub pad group GPd of the plurality of electrode pads BP included in the third sub pad group GPc, and the electrode pad BP situated closest to the third sub pad group GPc of the plurality of electrode pads BP included in the fourth sub pad group GPd are arranged at a larger pitch than the first pitch. Namely, in the foregoing embodiment, the plurality of electrode pads BP included in the fourth pad group G4 are arranged at the same pitch. In contrast, in Modified Example 4, as shown in FIG. 21, there is a portion in which the electrode pads BP are arranged at a larger pitch than the first pitch. In other words, the fourth pad group G4 has a part in which the plurality of electrode pads BP are not arranged at an equal pitch. Then, the plurality of bonding wires BW to be respectively connected with the plurality of electrode pads BP forming the third sub pad group GPc each have an inwardly falling loop shape.

Incidentally, FIG. 21 shows one electrode pad BP as the plurality of electrode pads BP forming the third sub pad group GPc for ease of understanding. The third sub pad group GPc is formed of a plurality of electrode pads BP. However, the third sub pad group GPc formed of one electrode pad BP is not excluded.

As with the semiconductor device SM4 in accordance with Modified Example 4, by taking the part having different intervals between the electrode pads BP in the plurality of electrode pads BP forming one pad group (the third pad group G3 and the fourth pad group G4 in Modified Example 4) as the boundary, the bonding wires BW having an inwardly falling loop shape can be determined.

Namely, for example, in the third pad group G3, the bonding wires BW to be respectively connected with the plurality of electrode pads BP forming the first sub pad group GPa situated on the first side S1 side are formed in an inwardly falling loop shape. Whereas, for example, in the fourth pad group G4, the bonding wires BW to be respectively connected with the plurality of electrode pads BP forming the third sub pad group GPc situated on the second side S2 side are formed in an inwardly falling loop shape.

As a result, as with the foregoing embodiment, it is possible to circumvent peeling of the bonding wire BW (first problem), cutting of the bonding wire BW (second problem), and wire sweep of the bonding wire BW (third problem).

Incidentally, in Modified Example 4 the electrode pads BP having mutually different intervals are arranged in the third pad group G3 and the fourth pad group G4, respectively. However, it is naturally understood that electrode pads BP having mutually different intervals can be arranged in the first pad group G1 and the second pad group G2, respectively. Also in this case, by taking the part having different intervals between the electrode pads BP in the plurality of electrode pads BP forming the first pad group G1 and the second pad group G2 as the boundary, the bonding wires BW having an inwardly falling loop shape can be determined.

Modified Example 5

A semiconductor device in accordance with Modified Example 5 of the present embodiment will be described by reference to FIG. 22.

Figure 22:
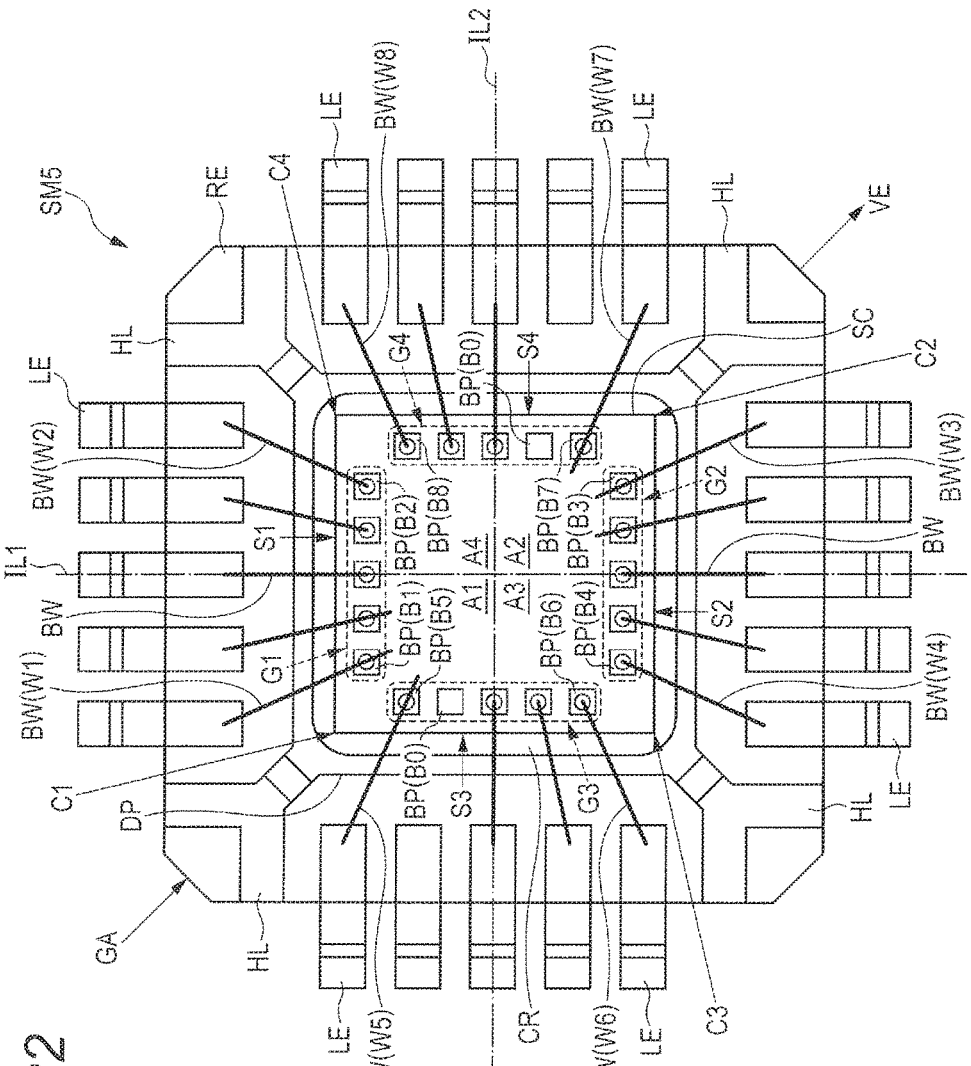
FIG. 22 is a top view of a semiconductor device in accordance with Modified Example 5 of the embodiment.

FIG. 22 is a top view of the semiconductor device in accordance with Modified Example 5 of the present embodiment.

Incidentally, the difference between the semiconductor device SM5 in accordance with Modified Example 5 and the semiconductor device SM in accordance with the foregoing embodiment resides in the presence or absence of the bonding wire. Other configurations are almost equal therebetween. Below, the difference will be mainly described.

As shown in FIG. 22, the plurality of electrode pads BP included in the first pad group G1 are, as with the Modified Example 4, arranged, for example, at the first pitch. Then, the plurality of bonding wires BW to be respectively connected with the first electrode pad B1 situated closest to the first corner part C1 of the semiconductor chip SC, and the electrode pad BP situated adjacent to the first electrode pad B1 along the first side S1 each have an inwardly falling loop shape.

Further, the plurality of electrode pads BP included in the second pad group G2 are arranged at, for example, the first pitch. Then, the bonding wires BP to be respectively connected with the third electrode pad B3 situated closest to the second corner part C2 of the semiconductor chip SC, and the electrode pad BP situated adjacent to the third electrode pad B3 along the second side S2 each have an inwardly falling loop shape.

Whereas, the plurality of electrode pads BP included in the third pad group G3 are arranged at, for example, the first pitch, and include an electrode pad B0 not to be connected with a bonding wire BW arranged therein. Then, the plurality of bonding wires BW to be respectively connected with the fifth electrode pad B5 situated closest to the first corner part C1 of the semiconductor chip SC, and the electrode pads BP situated between the fifth electrode pad B5 and the electrode pad B0 not to be connected with a bonding wire BW each have an inwardly falling loop shape.

Incidentally, in FIG. 22, for ease of understanding, the electrode pads BP between the fifth electrode pad B5 and the electrode pad B0 not to be connected with a bonding wire BW are not shown.

Further, the plurality of electrode pads BP included in the fourth pad group G4 are arranged at, for example, the first pitch, and include the electrode pad B0 not to be connected with a bonding wire BW arranged therein. Then, the plurality of bonding wires BW to be respectively connected with the seventh electrode pad B7 situated closest to the second corner part C2 of the semiconductor chip SC, and the electrode pads BP situated between the seventh electrode pad B7 and the electrode pad B0 not to be connected with a bonding wire BW each have an inwardly falling loop shape.

Incidentally, in FIG. 22, for ease of understanding, the electrode pads BP between the seventh electrode pad B7 and the electrode pad B0 not to be connected with a bonding wire BW are not shown.

As with the semiconductor device SM5 in accordance with Modified Example 5, in the plurality of electrode pads BP forming one pad group (in Modified Example 5, the third pad group G3 and the fourth pad group G4), by taking the electrode pad BP not to be connected with a bonding wire BW as the boundary, the bonding wires BW having an inwardly falling loop shape can be determined.

Namely, for example, in the third pad group G3, the bonding wire BW to be respectively connected with a plurality of electrode pads BP situated between the electrode pad BP not to be connected with a bonding wire BW and the first side S1 are formed in an inwardly falling loop shape. Further, for example, in the fourth pad group G4, the bonding wires BW to be respectively connected with a plurality of electrode pads BP situated between the electrode pad not to be connected with a bonding wire BW and the second side S2 are formed in an inwardly falling loop shape.

As a result, as with the foregoing embodiment, it is possible to circumvent peeling of the bonding wire BW (first problem), cutting of the bonding wire BW (second problem), and wire sweep of the bonding wire BW (third problem).

Incidentally, in Modified Example 5, the electrode pads B0 each not to be connected with a bonding wire BW were arranged in the third pad group G3 and the fourth pad group G4. However, it is naturally understood that the electrode pads B0 each not to be connected with a bonding wire BW can be arranged in the first pad group G1 and the second pad group G2. Also in this case, in the plurality of electrode pads BP respectively forming the first pad group G1 and the second pad group G2, by taking the electrode pad BP not to be connected with a bonding wire BW as the boundary, the bonding wires BW having an inwardly falling loop shape can be determined.

What is claimed is:

1. A method of manufacturing a semiconductor device comprising the steps of:
   (a) providing a lead frame having a die pad that has an upper surface and a lower surface opposite to the upper surface, and that is comprised of a quadrangle, a plurality of supporting leads for supporting the die pad, and a plurality of leads arranged around the die pad in plan view;
   (b) after the step (a), mounting a semiconductor chip that has a main surface, a back surface opposite to the main surface and a plurality of electrode pads formed on the main surface, and that is comprised of a quadrangle, on the upper surface of the die pad such that the back surface and the upper surface of the die pad face to each other;
   (c) after the step (b), connecting the plurality of electrode pads and the plurality of leads via a plurality of wires, respectively; and
   (d) after the step (c), sealing the semiconductor chip and the plurality of wires by a resin,
   wherein, in plan view, the semiconductor chip has a first side, a second side facing to the first side, a third side crossing each of the first side and the second side, and a fourth side crossing each of the first side and the second side, and facing to the third side, a first corner part at which the first side and the third side intersect with each other, a second corner part at which the second side and the fourth side intersect with each other, a third corner part at which the third side and the second side intersect with each other, and a fourth corner part at which the fourth side and the first side intersect with each other,
   wherein, in plan view, the plurality of electrode pads include a first pad group that is situated closer to the first side than to the second side, and that is arranged along the first side, a second pad group that is situated closer to the second side than to the first side, and that is arranged along the second side, a third pad group that is situated closer to the third side than to the fourth side, and that is arranged along the third side, and a fourth pad group that is situated closer to the fourth side than to the third side, and that is arranged along the fourth side,
   wherein the first pad group includes a first pad situated closest to the first corner part, and a second pad situated far away from the first corner part than the first pad,
   wherein the second pad group includes a third pad situated closest to the second corner part, and a fourth pad situated far away from the second corner part than the third pad,
   wherein the third pad group includes a fifth pad situated closest to the first corner part, and a sixth pad situated far away from the first corner part than the fifth pad,
   wherein the fourth pad group includes a seventh pad situated closest to the second corner part, and an eighth pad situated far away from the second corner part than the seventh pad
   wherein the plurality of wires includes a first wire to be connected with each of the first pad, the third pad, the fifth pad, and the seventh pad, and a second wire to be connected with each of the second pad, the fourth pad, the sixth pad, and the eighth pad,
   wherein, in the step (c), the plurality of wires is connected with the plurality of electrode pads, respectively, such that a first bending angle of a first core part with respect to the normal direction at a junction part between the first core part and a first ball part of the first wire is larger than a second bending angle of a second core part with respect to the normal direction at a junction part between the second core part and a second ball part of the second wire, and
   wherein, in the step (d), the resin is supplied from the first corner part side toward the second corner part side.

2. The method for manufacturing a semiconductor device according to claim 1,
   wherein, in the step (c), in each of the wires, after a part of the wire is connected with the electrode pad, the other part of the wire is connected with the lead.

3. The method for manufacturing a semiconductor device according to claim 1,
wherein the loop height of the first wire from the main surface of the semiconductor chip and the loop height of the second wire from the main surface of the semiconductor chip are equal to each other.

4. The method for manufacturing a semiconductor device according to claim 1,
wherein, in plan view, the length of the first wire is larger than the length of the second wire.

5. The method for manufacturing a semiconductor device according to claim 1,
wherein the second pad is the electrode pad situated closest to the fourth corner part of the semiconductor chip of the first pad group,
wherein the fourth pad is the electrode pad situated closest to the third corner part of the semiconductor chip of the second pad group,
wherein the sixth pad is the electrode pad situated closest to the third corner part of the semiconductor chip of the third pad group, and
wherein the eighth pad is the electrode pad situated closest to the fourth corner part of the semiconductor chip of the fourth pad group.

6. The method for manufacturing a semiconductor device according to claim 1,
wherein, in plan view, the main surface of the semiconductor chip has a first region including the first corner part, a second region including the second corner part, a third region including the third corner part, and a fourth region including the fourth corner part, divided by a first virtual line passing through the center of the first side and the center of the second side, and a second virtual line passing through the center of the third side and the center of the fourth side,
wherein each wire to be connected with electrode pads situated in the first region and the second region, respectively, of the plurality of electrode pads is the first wire, and
wherein each wire to be connected with electrode pads situated in the third region and the fourth region, respectively, of the plurality of electrode pads is the second wire.

7. The method for manufacturing a semiconductor device according to claim 1,
wherein the first pad group is divided into a first sub pad group including the first pad, and a second sub pad group including the second pad,
wherein the second pad group is divided into a third sub pad group including the third pad, and a fourth sub pad group including the fourth pad,
wherein the electrode pads forming the first sub pad group and the electrode pads forming the second sub pad group of the plurality of electrode pads are arranged at a first pitch, respectively,
wherein the electrode pads forming the third sub pad group and the electrode pads forming the fourth sub pad group of the plurality of electrode pads are arranged at a second pitch, respectively,
wherein the interval between the electrode pad arranged closest to the second sub pad group of the electrode pads forming the first sub pad group, and the electrode pad arranged closest to the first sub pad group of the electrode pads forming the second sub pad group is larger than the first pitch,
wherein the interval between the electrode pad arranged closest to the fourth sub pad group of the electrode pads forming the third sub pad group, and the electrode pad arranged closest to the third sub pad group of the electrode pads forming the fourth sub pad group is larger than the second pitch,
wherein each of the electrode pads forming the first sub pad group and the electrode pads forming the third sub pad group is connected with the first wire, and
wherein each of the electrode pads forming the second sub pad group and the electrode pads forming the fourth sub pad group is connected with the second wire.

8. The method for manufacturing a semiconductor device according to claim 7,
wherein an electrode pad not to be connected with a wire is arranged between the electrode pad arranged closest to the the second sub pad group of the electrode pads forming the first sub pad group, and the electrode pad arranged closest to the first sub pad group of the electrode pads forming the second sub pad group, and
wherein an electrode pad not to be connected with a wire is arranged between the electrode pad arranged closest to the the fourth sub pad group of the electrode pads forming the third sub pad group, and the electrode pad arranged closest to the third sub pad group of the electrode pads forming the fourth sub pad group.

9. The method for manufacturing a semiconductor device according to claim 1,
wherein, in the step (d), the resin is supplied from the top surface side and the lower surface side, or from the lower surface side of the supporting lead provided on the first corner part side of the semiconductor chip.

10. The method for manufacturing a semiconductor device according to claim 1,
wherein, in the step (d), the lower surface of the die pad is exposed from the resin.

11. A method for manufacturing a semiconductor device comprising the steps of:
(a) providing a lead frame having a die pad that has an upper surface and a lower surface opposite to the upper surface, and that is comprised of quadrangle, a plurality of supporting leads for supporting the die pad, and a plurality of leads arranged around the die pad in plan view;
(b) after the step (a), mounting a semiconductor chip that has a main surface, a back surface opposite to the main surface, and a plurality of electrode pads formed on the main surface, and that is comprised of a quadrangle, on the upper surface of the die pad such that the back surface and the upper surface of the die pad face to each other;
(c) after the step (b), connecting the plurality of electrode pads and the plurality of leads via a plurality of wires, respectively; and p1 (d) after the step (c), sealing the semiconductor chip and the plurality of wires by a resin,
wherein, in plan view, the semiconductor chip has a first side, a second side facing to the first side, a third side crossing each of the first side and the second side, and a fourth side crossing each of the first side and the second side, and facing to the third side, a first corner part at which the first side and the third side intersect with each other, a second corner part at which the second side and the fourth side intersect with each other, a third corner part at which the third side and the second side intersect with each other, and a fourth corner part at which the fourth side and the first side intersect with each other, wherein, in plan view, the plurality of electrode pads include a first pad group that is situated closer to the first side than to the second side, and that is arranged along the first side, a second pad group that is situated closer to the second side than to the first side, and that is arranged along the second side, a third pad group that is situated closer to the third side than to the fourth side, and that is arranged along the third side, and a fourth pad group that is situated closer to the fourth side than to the third side, and that is arranged along the fourth side, wherein the first pad group includes a first pad situated closest to the first corner part, and a second pad situated far away from the first corner part than the first pad, wherein the second pad group includes a third pad situated closest to the second corner part, and a fourth pad situated far away from the second corner part than the third pad, wherein the third pad group includes a fifth pad situated closest to the first corner part, and a sixth pad situated far away from the first corner part than the fifth pad, wherein the fourth pad group includes a seventh pad situated closest to the second corner part, and an eighth pad situated far away from the second corner part than the seventh pad wherein the plurality of wires include a first wire to be connected with each of the first pad, the third pad, the fifth pad, and the seventh pad, and a second wire to be connected with each of the second pad, the fourth pad, the sixth pad, and the eighth pad, wherein a first wire diameter of the first wire is larger than a second wire diameter of the second wire, and wherein, in the step (d), the resin is supplied from the first corner part side toward the second corner part side.

12. The method for manufacturing a semiconductor device according to claim 11, wherein the second pad is the electrode pad situated closest to the fourth corner part of the semiconductor chip of the first pad group, wherein the fourth pad is the electrode pad situated closest to the third corner part of the semiconductor chip of the second pad group, wherein the sixth pad is the electrode pad situated closest to the third corner part of the semiconductor chip of the third pad group, and wherein the eighth pad is the electrode pad situated closest to the fourth corner part of the semiconductor chip of the fourth pad group.

13. The method for manufacturing a semiconductor device according to claim 11, wherein, in plan view, the main surface of the semiconductor chip has a first region including the first corner part, a second region including the second corner part, a third region including the third corner part, and a fourth region including the fourth corner part, divided by a first virtual line passing through the center of the first side and the center of the second side, and a second virtual line passing through the center of the third side and the center of the fourth side, wherein each wire to be connected with the electrode pads situated in the first region and the second region, respectively, of the plurality of electrode pads is the first wire, and wherein each wire to be connected with the electrode pads situated in the third region and the fourth region, respectively, of the plurality of electrode pads is the second wire.

14. The method for manufacturing a semiconductor device according to claim 11, wherein in the step (d), the resin is supplied from the upper surface side and the lower surface side, or from the lower surface side of the supporting lead provided on the first corner part side of the semiconductor chip.

15. The method for manufacturing a semiconductor device according to claim 11, wherein in the step (d), the lower surface of the die pad is exposed from the resin.

16. A method for manufacturing a semiconductor device comprising the steps of:

(a) providing a lead frame having a die pad that has an upper surface and a lower surface opposite to the upper surface, and that is comprised of a quadrangle, a plurality of supporting leads for supporting the die pad, and a plurality of leads arranged around the die pad in plan view;

(b) after the step (a), mounting a semiconductor chip that has a main surface, a back surface opposite to the main surface, and a plurality of electrode pads formed on the main surface, and that is comprised of a quadrangle, on the upper surface of the die pad such that the back surface and the upper surface of the die pad face to each other;

(c) after the step (b), connecting the plurality of electrode pads and the plurality of leads via a plurality of wires, respectively; and (d) after the step (c), sealing the semiconductor chip and the plurality of wires by a resin, wherein, in plan view, the semiconductor chip has a first side, a second side facing to the first side, a third side crossing each of the first side and the second side, and a fourth side crossing each of the first side and the second side, and facing to the third side, a first corner part at which the first side and the third side intersect with each other, a second corner part at which the second side and the fourth side intersect with each other, a third corner part at which the third side and the second side intersect with each other, and a fourth corner part at which the fourth side and the first side intersect with each other, wherein, in plan view, the plurality of electrode pads include a first pad group that is situated closer to the first side than to the second side, and that is arranged along the first side, a second pad group that is situated closer to the second side than to the first side, and that is arranged along the second side, a third pad group that is situated closer to the third side than to the fourth side, and that is arranged along the third side, and a fourth pad group that is situated closer to the fourth side than to the third side, and that is arranged along the fourth side, wherein, in the step (c), in plan view, the plurality of wires are connected with the plurality of electrode pads, respectively, such that each of the wires extends in the inward direction of the semiconductor chip from a junction part with the lead beyond a junction part with the electrode pad, and wherein in the step (d), the resin is supplied from the first corner part side toward the second corner part side.

17. The method for manufacturing a semiconductor device according to claim 16, wherein in the step (c), in each of the wires, after a part of the wire is connected with the electrode pad, the other part of the wire is connected with the lead.

18. The method for manufacturing a semiconductor device according to claim 16,
   wherein in the step (d), the resin is supplied from the upper surface side and the lower surface side, or from the lower surface side of the supporting lead provided on the first corner part side of the semiconductor chip.

19. The method for manufacturing a semiconductor device according to claim 16,
   wherein in the step (d), the lower surface of the die pad is exposed from the resin.

* * * * *